(12) United States Patent
Andre

(10) Patent No.: US 9,472,256 B1
(45) Date of Patent: Oct. 18, 2016

(54) MAGNETIC MEMORY HAVING TWO TRANSISTORS AND TWO MAGNETIC TUNNEL JUNCTIONS PER MEMORY CELL

(71) Applicant: Everspin Technologies, Inc., Chandler, AZ (US)

(72) Inventor: Thomas Andre, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 14/872,678

(22) Filed: Oct. 1, 2015

Related U.S. Application Data

(60) Provisional application No. 62/058,534, filed on Oct. 1, 2014.

(51) Int. Cl.
*G11C 11/16* (2006.01)

(52) U.S. Cl.
CPC ............ *G11C 11/16* (2013.01); *G11C 11/1673* (2013.01); *G11C 11/1675* (2013.01)

(58) Field of Classification Search
CPC  G11C 11/16; G11C 11/1673; G11C 11/1675
See application file for complete search history.

(56) References Cited

U.S. PATENT DOCUMENTS

| | | | |
|---|---|---|---|
| 7,286,395 B2 * | 10/2007 | Chen ........................ | G11C 11/16 365/158 |
| 2002/0057593 A1 * | 5/2002 | Hidaka ................... | B82Y 10/00 365/171 |
| 2011/0267874 A1 * | 11/2011 | Ryu ........................ | G11C 11/16 365/158 |
| 2013/0322161 A1 * | 12/2013 | Noguchi ............. | G11C 11/1675 365/158 |

\* cited by examiner

*Primary Examiner* — Han Yang
*Assistant Examiner* — Ajay Ojha

(57) ABSTRACT

Circuits and methods for driving generating multiple word line voltages used for writing to two-transistor two-magnetic tunnel junction (2T2MTJ) spin-torque magnetic random access memory (MRAM) cells. Some embodiments include auto-booting isolated word lines using common lines such as bit and source lines that are capacitively coupled to the word lines. Different memory architectures for 2T2MTJ memory arrays are also presented that include read/write circuits and word line drivers.

20 Claims, 15 Drawing Sheets

US 9,472,256 B1

MAGNETIC MEMORY HAVING TWO TRANSISTORS AND TWO MAGNETIC TUNNEL JUNCTIONS PER MEMORY CELL

CROSS REFERENCE TO RELATED APPLICATIONS

This application claims priority to U.S. Provisional Application No. 62/058,534 filed Oct. 1, 2014. The content of that provisional application is incorporated by reference herein in its entirety.

TECHNICAL FIELD

The disclosure herein relates generally to spin-torque magnetic memory devices having two select devices and two magnetic tunnel junctions in each memory cell, and, more particularly, to circuits and methods for accessing such memory cells for read and write operations.

BACKGROUND

Spin-torque magnetic memory devices store information by controlling the resistance across a magnetic tunnel junction (MTJ) such that a read current through the magnetic tunnel junction results in a voltage drop having a magnitude that is based on the state of the magnetic tunnel junction stack. The resistance in each magnetic tunnel junction can be varied based on the relative magnetic states of the magnetoresistive layers within the magnetic tunnel junction stack. In such memory devices, there is typically a portion of the magnetic tunnel junction stack that has a fixed magnetic state and another portion that has a free magnetic state that is controlled to be either of two possible states relative to the portion having the fixed magnetic state. Because the resistance through the magnetic tunnel junction changes based on the orientation of the free portion to the fixed portion, information can be stored by setting the orientation of the free portion. The information is later retrieved by sensing the orientation of the free portion. Such magnetic memory devices are well known in the art.

There is a need for memory architectures and the access circuitry used to store and retrieve data from magnetic tunnel junction based memory cells that allow for accurate storage and retrieval of information with short access times.

DETAILED DESCRIPTION

Figure 1:
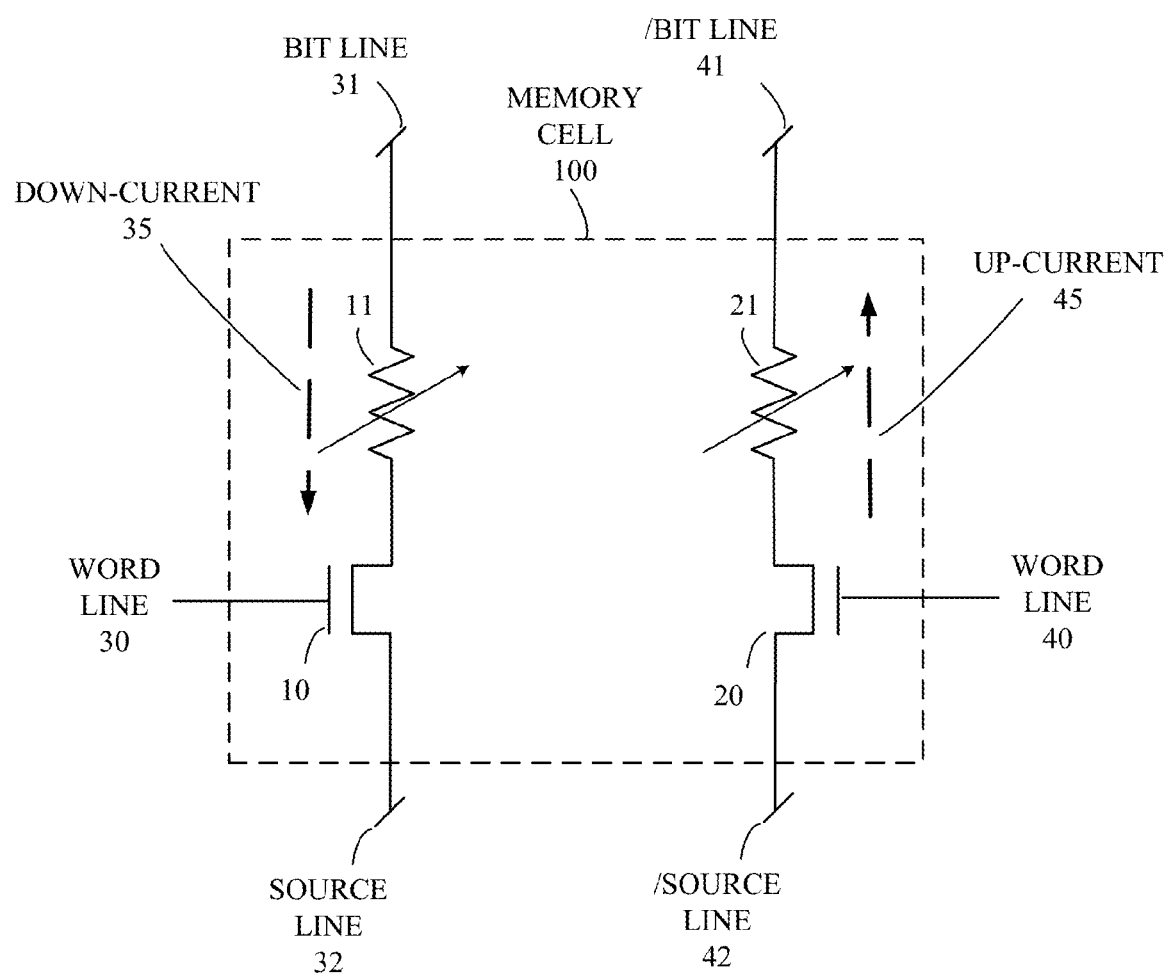
FIG. 1 is a schematic diagram of a two-transistor two-magnetic tunnel junction (2T2MTJ) memory cell in accordance with an exemplary embodiment.

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to assist improve understanding of the example embodiments.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, generation of bias voltages, fundamental principles of magnetism, and basic operational principles of memory devices.

During the course of this description, like numbers may be used to identify like elements according to the different figures that illustrate the various exemplary embodiments.

For the sake of brevity, conventional techniques related to reading and writing memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

The various embodiments presented herein are based on a magnetic memory device architecture that includes two-magnetic tunnel junctions and two corresponding select devices in each memory cell. This may be referred to as a 2T2MTJ memory device. Because the resistance through different magnetic tunnel junctions can vary significantly, the two magnetic tunnel junctions in the memory cell are written to complementary states to store a single bit of information. The bit stored in the memory cell can be readily determined by comparing the states of the two magnetic tunnel junctions. This can be more reliable and faster than comparing the resistance of a single MTJ with a reference. In one example of a 2T2MTJ memory cell storing a bit having the value "0", the first magnetic tunnel junction is in the first state (e.g. lower resistance), and the second magnetic tunnel junction is in the second state (e.g. higher resistance). If the first magnetic tunnel junction is in the second state (e.g. higher resistance) and the second magnetic tunnel junction is in the first state (e.g. lower resistance), that can represent the memory cell storing a "1."

As discussed in more detail below, circuits and techniques for reading from and writing to 2T2MTJ memory cells are presented that enable accurate reading and writing of data with short access times. For example, circuits and techniques are provided for generating the appropriate word line voltages needed to perform the write operations to such memory cells. This includes circuits capable of driving two different word line voltages onto the two word lines associated with each memory cell. In some embodiments, isolation and auto-booting of one of the word lines is used, where a feedback path can be used to maintain the proper word line voltage on the other word line. Such techniques can reduce the switching time associated with write operations by enabling simultaneous switching of two or more magnetic tunnel junctions associated with a single memory cell. Additionally, read circuits and sense amplifiers associated with reading the stored information in 2TMTJ memory cells are described.

FIG. 1 illustrates a 2T2MTJ memory cell 100. Memory cell 100 includes a first magnetic tunnel junction 11 coupled in series with a first select device 10 as well as a second magnetic tunnel junction 21 coupled in series with a second select device 20. Each magnetic tunnel junction 11, 12 is coupled to a corresponding select device 10, 20 to allow each magnetic tunnel junction to be individually selected for access. The magnetic tunnel junction 11 and select device 10 are coupled in series between a bit line 31 and a source line 32. The bit line 31 and the source line 32 allow for different currents or voltages to be applied to the series circuit formed by the magnetic tunnel junction 11 and select device 10. Similarly, magnetic tunnel junction 21 and select device 20 are coupled in series between/bit line 41 ("bit line bar") and/source line 42 ("source line bar"). In other embodiments, the signal lines used to provide the various voltages and currents to the magnetic tunnel junctions may be referred to by names other than "source line" and "bit line." In the present disclosure, the lines used to apply the voltage/current to the MTJs are referred to as "common lines," "bit lines," and "source lines" in order to promote a better understanding of the various inventions disclosed herein.

As noted above, in a 2T2MTJ memory cell, a single data bit is stored by storing complementary states in the two magnetic tunnel junctions included in the memory cell. For a read operation, the resistance across the magnetic tunnel junction 11 is detected and compared with the resistance across the magnetic tunnel junction 21. In some embodiments, this is accomplished by applying a voltage at each of bit line 31 and/bit line 41 while pulling the source line 32 and/source line 42 to a lower voltage (e.g. ground). In other embodiments, a matched current source may be used to apply a known current through each of the magnetic tunnel junctions 11, 21. The resulting currents from the voltage applied across the magnetic tunnel junctions can be compared to determine which has the higher resistance. Similar, for embodiments that drive a matched current through the magnetic tunnel junctions, the voltage drop across each of the two magnetic tunnel junctions can be compared to determine the bit stored in the memory cell.

Word lines 30 and 40, which are coupled to the gates of select devices 10 and 20, respectively, are used to control the access to the magnetic tunnel junctions and 11 and 21. When the gates of the select devices are driven high, current is allowed to flow through the magnetic tunnel junctions. For a read operation, each of word lines 30, 40 is driven to the same voltage level such that the voltage/current through each of the magnetic tunnel junctions 11, 21 is presented with the same biasing with respect to the select devices 10, 20, thereby enabling and accurate comparison of the states of the two magnetic tunnel junctions 11, 21. The comparison of the state of the two magnetic tunnel junctions 11, 21 may be performed by a read circuit, where one example of such a read circuit is a sense amplifier that senses the difference between the two states and determines the single bit represented by those stored states. Because the magnetic tunnel junctions store complementary states, the comparison is simple in that one will have a higher resistance than the other. As such, the magnitude of the resistance difference is less important than in other non-2T2MTJ memory devices.

In a spin-torque magnetic memory, writing a state to the magnetic tunnel junctions 11, 21 is accomplished by sending a spin-polarized write current through the magnetic tunnel junctions 11, 21 where the angular momentum carried by the spin-polarized current can change the magnetic state of the free portion. One of ordinary skill in the art understands that such a current can either be directly driven through the magnetic tunnel junctions or can be the result of applying one or more voltages across the magnetic tunnel junction, where the applied voltages result in the desired current. Depending on the direction of the current through the magnetic tunnel junction, the resulting magnetization of the free portion will either be the first state or the second state. In such memories, the magnitude of the write current is typically greater than the magnitude of a read current used to sense the information stored in the memory cells. In the case of a two-magnetic tunnel junction memory cell, storing a bit in the memory cell requires two opposite currents to be passed through the two magnetic tunnel junctions in order to store the two different states in those magnetic tunnel junctions.

In the example illustrated in FIG. 1, a down-current 35 is sent through the magnetic tunnel junction 11, whereas an up-current 45 is sent through the magnetic tunnel junction 21. Thus, in the example illustrated, the magnetic tunnel junction 11 is being written to the low resistance state, whereas the magnetic tunnel junction 21 is being written to the higher resistance state. In other embodiments, a down-current write can correspond to storing a higher resistance state and an up-current write can correspond to storing a lower resistance state.

In order to enable the amount of current necessary to switch the magnetic orientation of the magnetic tunnel junctions 11, 21, the word line voltages applied on the word lines 30, 40 may have to be greater than a power supply voltage available on the memory device. For example, if the power supply voltage associated with various logic circuitry on the memory device is inadequate to bias the select devices 10, 20 at the level needed to allow for sufficient current flow, a greater word line voltage may be generated on the memory device using the voltage supplies available. Such elevated voltages can be achieved using charge pumps or other well-known circuitry. As discussed in more detail below, other techniques, including auto-booting, can be used to achieve the needed word line voltages for write operations to the 2T2MTJ memory cells.

In order to allow adequate current flow through the magnetic tunnel junction 11, the word line 30 is driven to a voltage level such that the gate voltage on select device 10 is sufficiently high to permit the needed current flow while not being unnecessarily high such that the gate-to-source voltage on select device 10 leads to breakdown of the transistor. Because down-current 35 is flowing first through the magnetic tunnel junction 11 and then select device 10, the bit line 31 is pulled to a higher voltage then the source line 32. In one embodiment, the source line 32 is pulled to ground or close to ground, thereby placing the source of select device 10 at or near ground. As such, the voltage driven on word line 30 is limited to a gate voltage only as high as the maximum desired gate to source voltage. However, with respect to magnetic tunnel junction 21, the/bit line 41 is pulled low, and the/source line 42 is driven to a higher voltage in order to result in up-current 45. Rather than being at ground, the source of the select device 20 is at a voltage corresponding to the voltage drop across the magnetic tunnel junction 21. As such, the gate to source voltage on select device 20 is equal to the voltage on the gate as driven by word line 40 minus the voltage drop across the magnetic tunnel junction 21. Thus, a higher gate voltage can be applied to select device 20 as compared to select device 10. In some embodiments, it is preferable to apply the highest gate voltage to the select devices 10, 20 that doesn't result in premature breakdown of the select devices as this maximizes write current flow and enables faster switching of the free portions. Therefore, in order to simultaneously write the complementary states to the magnetic tunnel junctions 11, 21, two different word line voltages can be used in order to optimize the down current 35 and up current 45 used to store the complementary states in the magnetic tunnel junctions 11 and 21.

Figure 2:
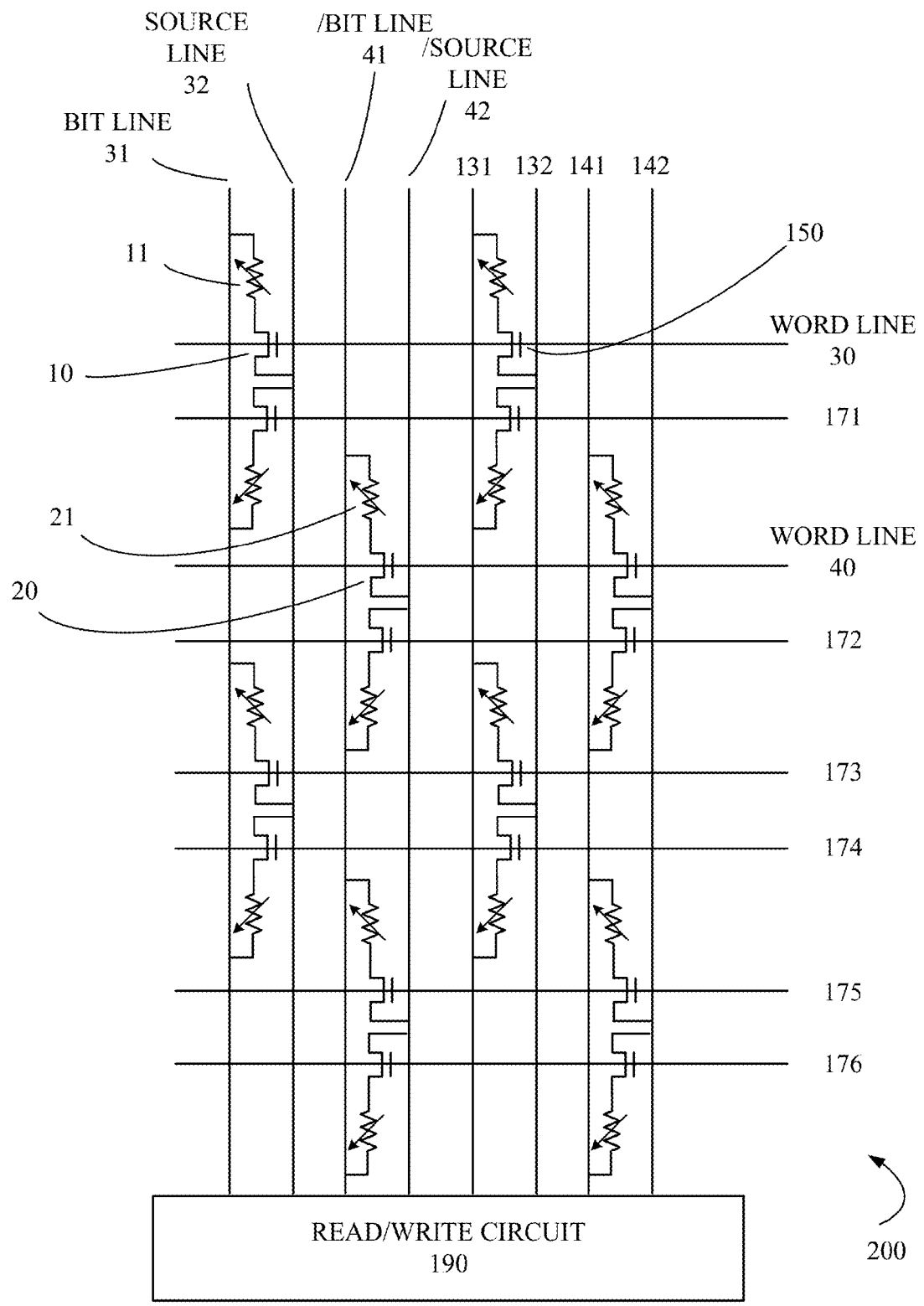
FIG. 2 is a schematic diagram of a portion of a magnetic memory device that includes 2T2MTJ memory cells in accordance with an exemplary embodiment.

Circuits and techniques for generating the two different word line voltages required for simultaneous writing to both magnetic tunnel junctions in the 2T2MTJ memory cell architecture are disclosed herein. A number of different architectural arrangements of the magnetic tunnel junctions, corresponding select devices, and routing of the bit and source lines are also presented. FIG. 2 is a schematic diagram of a portion of a magnetic memory device 200 that includes a plurality of 2T2MTJ memory cells, including the memory cell 100 of FIG. 1. As shown, a first half of the memory cell 100 includes magnetic tunnel junction 11 and select device 10 coupled between bit line 31 and source line 32. The gate of select device 10 is coupled to word line 30. As shown, additional magnetic tunnel junctions and select devices are coupled to bit line 31, source line 32, and word line 30. However, by controlling the respective voltages on bit lines, source lines, and word lines, each magnetic tunnel junction in the array can be individually selected for read and write operations. Read/write circuit 190 includes the drivers to drive the bit and source lines as well as the read circuitry used to determine the states of the magnetic tunnel junctions and resulting data bits stored in the memory cells.

The complementary half of memory cell 100 includes magnetic tunnel junction 21 and select device 20, which are coupled in series between/bit line 41 and/source line 42. Word line 40 is coupled to the gate of the select device 20. FIG. 2 illustrates a total of eight memory cells arranged in four columns, where the first half of each memory cell is included in a column neighboring the second half of the memory cell. Thus, the select device 10 is included in a first plurality of select devices in the first column, all of which are coupled to source line 32. The select device 20 is included in a second plurality of select devices in the second column, all of which are coupled to/source line 42. The neighboring columns can be labeled as even/odd columns, where one select device for each memory cell is included in an even column and the other is included in an odd column.

In an example operation, the single bit stored in the memory cell 100 can be determined during a read operation by comparing the states of magnetic tunnel junctions 11 and 12. In order to do perform the comparison, the read/write circuit 190 selectively drives bit line 31, source line 32, /bit line 41, and/source line 42. Which bit lines and source lines are driven is based on address information received by the memory device, where the address information is decoded and used to determine which cells are to be accessed. For example, an activate operation can cause an entire page of data within the memory device to be loaded in temporary data store registers, which may be the sense amplifiers used in detecting the stored bits. If the memory cell 100 is included in the page to be accessed, the read/write circuit 190 will use the decoded address to selectively drive the bit lines and source lines that need to be driven/monitored to determine the states of magnetic tunnel junctions 11 and 21.

When the bit stored by memory cell 100 is to be read, the word lines 30 and 40 are driven to a word line voltage used for reading, while the other word lines 171-176 included in the array are held at the low voltage supply (VSS), which may be ground. In some embodiments, the voltage applied to the word lines 30 and 40 for reading corresponds to a power supply voltage used for other logic on the memory device (logic supply voltage). In other embodiments, the voltage applied to the word lines 30 and 40 for reading corresponds to one of the word line voltages that is also used during write operations, where the word line voltages are different in magnitude than the logic supply voltage. In one example embodiment, the voltage applied on a word line corresponding to a down-current write may be driven onto both word lines 30 and 44 during a read operation.

Once word lines 30 and 40 are driven to the appropriate voltage, bit line 31 and/bit line 41 are driven to a first voltage, and then source line 32 and/source line 42 are driven to a second voltage, which is lower than the first voltage. Even though bit line 31 is at a high voltage and source line 32 is at a low voltage, current will only flow through magnetic tunnel junction 11 in the first column of the array depicted in FIG. 2 because all of the other word lines 171-176 are held low, thereby preventing current flow through the other select devices and magnetic tunnel junctions included in the first column. Similarly, word line 40 only enables current flow through select device 20 and magnetic tunnel junction 21 in the second column. Although word line 30 also turns on the select device 150 in the third column, bit line 131 and source line 132 are controlled by the read/write circuit 190 such that no significant current flows through select device 150.

By applying a matched voltage across (or matched current through) the complementary halves of the memory cell 100 while applying the same word line voltage to their respective select devices 10 and 20, the resistance through each of the magnetic tunnel junctions 11 and 21 can be detected and compared to determine the data bit represented by the complementary states of those magnetic tunnel junctions.

In another example operation corresponding to FIG. 2 that replicates the write operation corresponding to the down-current 35 and up-current 45 shown in FIG. 1, different word line voltages are simultaneously applied to word line 30 and word line 40. Once again, the word lines corresponding to memory cells that are not being accessed are held at VSS in order to prevent current flow through their respective magnetic tunnel junctions. A first voltage level is generated on word line 30, which corresponds to select device 10, where the first voltage level corresponds to the gate voltage on select device 10 used to support a down current write operation. As discussed above, in some embodiments, the first voltage level is a boosted voltage level above the logic supply voltage. A second voltage level is generated on word line 40, which corresponds to select device 20, where the second voltage level corresponds to the gate voltage on select device 20 used to support an up-current write operation. As discussed above, in some embodiments, the second voltage level is also a boosted voltage level and may have a magnitude higher than the first voltage level generated on word line 30. Circuits and techniques for generating these voltages are discussed in additional detail below.

Once the word lines 30, 40 are driven to the respective first and second voltages, bit line 31 is driven to a first bit line voltage. Source line 32 is then driven to a first source line voltage that is less than the first bit line voltage. This results in down-current 35 depicted in FIG. 1. In some embodiments, the higher voltage is driven onto the bit/source line before the lower voltage is applied to the other of the bit/source line in order to reduce stress on the select devices. For up-current 45, /source line 42 is driven to a second source line voltage. Preferably, /source line 42 is driven to the second source line voltage at about the same time as bit line 31 is driven to the first bit line voltage. After/source line 42 is driven to the second source line voltage, /bit line 41 is driven to a second bit line voltage, which is less than the second source line voltage. The higher voltage on/source line 42 results in up-current 45. Thus, both magnetic tunnel junctions 11 and 21 can be written to the desired state simultaneously.

Figure 3:
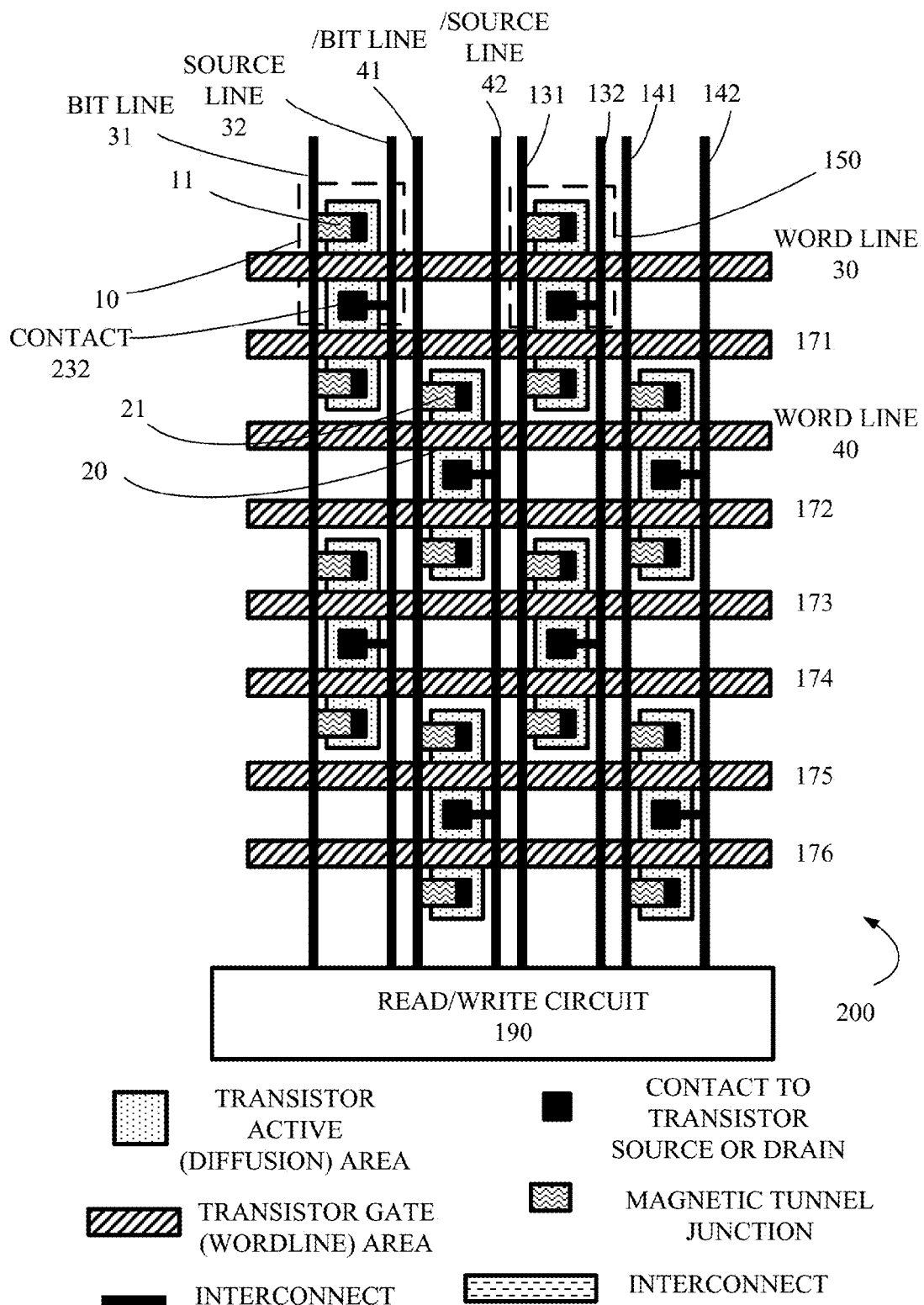
FIG. 3 is a layout diagrams representing a portion of a magnetic memory device that includes 2T2MTJ memory cells in accordance with an exemplary embodiment.

The architecture illustrated in FIG. 2 may be referred to as a "folded bit line" architecture in that both of the complementary halves of the memory cell are within the same array, and, in the embodiment shown in FIG. 2, the halves are included in neighboring even and odd columns. FIG. 3 illustrates a layout diagram corresponding to the architecture illustrated in FIG. 2. The layout shown in FIG. 3 discloses how the various materials used to manufacture the memory device array can be laid out on an integrated circuit. As shown in FIG. 3, the select device 10 (outlined by a dotted line box) underlies word line 30 such that, when the word line 30 places charge on the gate of select device 10, select device 10, which may be an NMOS transistor, establishes a connective path from the source line 32 through a contact 232, across the active area of the transistor underlying the word line 30, and then through the magnetic tunnel junction 11. Magnetic tunnel junction 11 is formed as a vertical stack and connects to the select device 10 below and the bit line 31 above. As shown in FIG. 3, because of the folded bit line architecture, the select devices and magnetic tunnel junctions in alternating columns are vertically offset slightly in order to provide for correct routing of the word lines.

Figure 4:
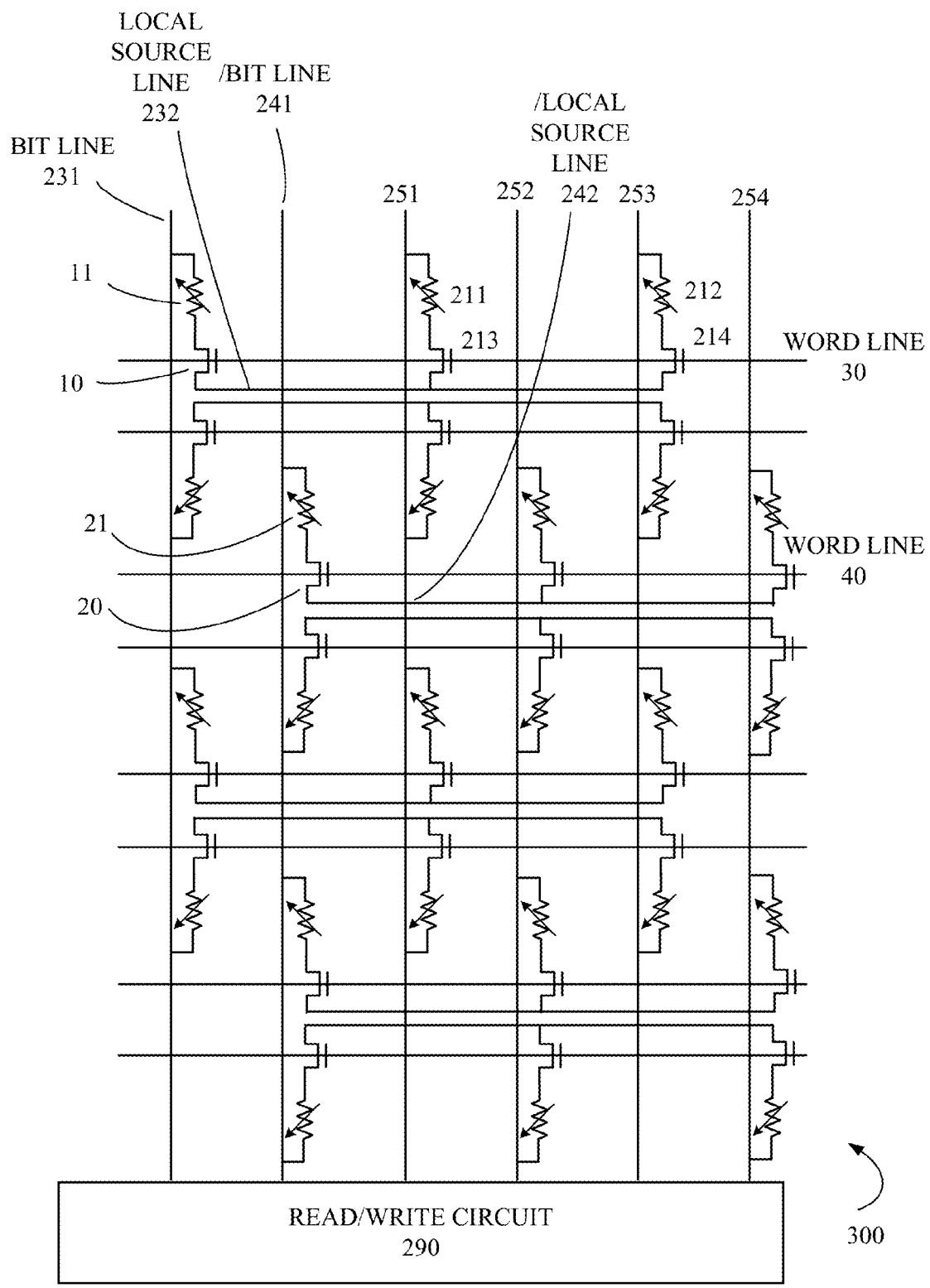
FIG. 4 is a schematic diagram of a portion of a magnetic memory device that includes 2T2MTJ memory cells in accordance with an exemplary embodiment.

FIG. 4 illustrates a portion of a memory array 300 that uses another memory device architecture for a 2T2MTJ memory cell array. As illustrated in FIG. 4, rather than having source lines that are directly driven by the read/write circuit 290, the architecture of FIG. 4 includes local source lines, including local source line 232 and/local source line 242. In order to increase density in magnetic memories that include spin torque memory cells, local source lines shared by a predefined set of memory cells can be employed in order to reduce the area needed for the memory array. Such local source lines are described in detail in U.S. Pat. No. 8,355,272, which issued Jan. 15, 2013, and which is assigned to the same assignee as the present application. The use of such local source lines can require increased power consumption as a large number of bit lines associated with the memory array are forced to a certain voltage during each operation. As described in U.S. patent application Ser. No. 14/495,151, which is entitled "WORD LINE AUTO-BOOTING IN A SPIN-TORQUE MAGNETIC MEMORY HAVING LOCAL SOURCE LINES," such additional power consumption can be leveraged to increase or otherwise adjust the voltage of word lines used to drive the select devices in the memory array, thereby "auto-booting" the word lines such that they reach a desired voltage level corresponding to writing operations. Application Ser. No. 14/495,151 is assigned to the same assignee as the present application and is incorporated by reference herein in its entirety. As shown below, auto-booting techniques enable some of the additional power required for supporting the local source lines to be harnessed and reused in a beneficial manner.

As shown in FIG. 4, the memory cell 100 of FIG. 1 is still divided into two halves that are in neighboring even and odd columns. The first half includes magnetic tunnel junction 11 and select device 10 that are coupled between bit line 231 and local source line 232. The second half includes magnetic tunnel junction 21 and select device 20 that are coupled in series between/bit line 241 and/local source line 242. In order to generate down-current through magnetic tunnel junction 11, the bit line 231 is driven to a first bit line voltage, and the bit lines 251 and 253 are driven to a second bit line voltage that is less than the first bit line voltage. Current flows through the magnetic tunnel junction 11, then through the select device 10 before being divided between the other select devices 213, 214 and corresponding magnetic tunnel junctions 211, 212 that are also coupled to the local source line 232. The current returns to the read/write circuit 290 via bit lines 251 and 253. The local source lines are not driven directly, but instead act as a coupling node that allows voltages to be applied on the bit lines coupled to each respective local source line to cause current to flow through the memory cells in one direction or the other depending on the voltages applied. Note that while FIG. 4 illustrates only three magnetic tunnel junctions coupled to each local source line for illustrative purposes, many more magnetic tunnel junctions typically share a local source line in order to avoid sending significant current through the non-active magnetic tunnel junctions that are providing the current path to the read/write circuit 290 from the shared source line.

Each of the select devices 10, 213, and 214 for the set of memory cells sharing the local source line 232 is controlled by the word line 30. Similarly, word line 40 controls select device 20 as well as the other select devices coupled to/local source line 242. While not shown in FIG. 4, word lines 30 and 40 may also be connected to other groups of select devices in other local source line sets, such as in a memory device that accesses many bits from the array or a set of sub-arrays during an activate operation.

In order to perform the same write operation described above with respect to FIG. 2, each of the bit lines 251-254 must driven in addition to bit line 231 and/bit line 241. The down current through magnetic tunnel junction 11 is generated by first pulling word line 30 to a high voltage associated with a down-current write. Subsequently, a high voltage is driven on bit line 231 while pulling bit lines 251 and 253 to a lower voltage. In order to generate the up current through magnetic tunnel junction 21, a word line voltage is generated on word line 40 that is sufficient to support the up-current write. As discussed in additional detail below, this may include isolating and auto-booting word line 40, thereby leveraging some of the charge necessarily placed on bit lines 252 and 254 to facilitate the up current write. Once the word line 40 is at the appropriate voltage, a high voltage is driven onto bit lines 252 and 254, while a lower voltage is applied to/bit line 241. This results in current flow through bit lines 252 and 254 onto the shared/local source line 242 and then through select device 20 and magnetic tunnel junction 21.

Figure 5:
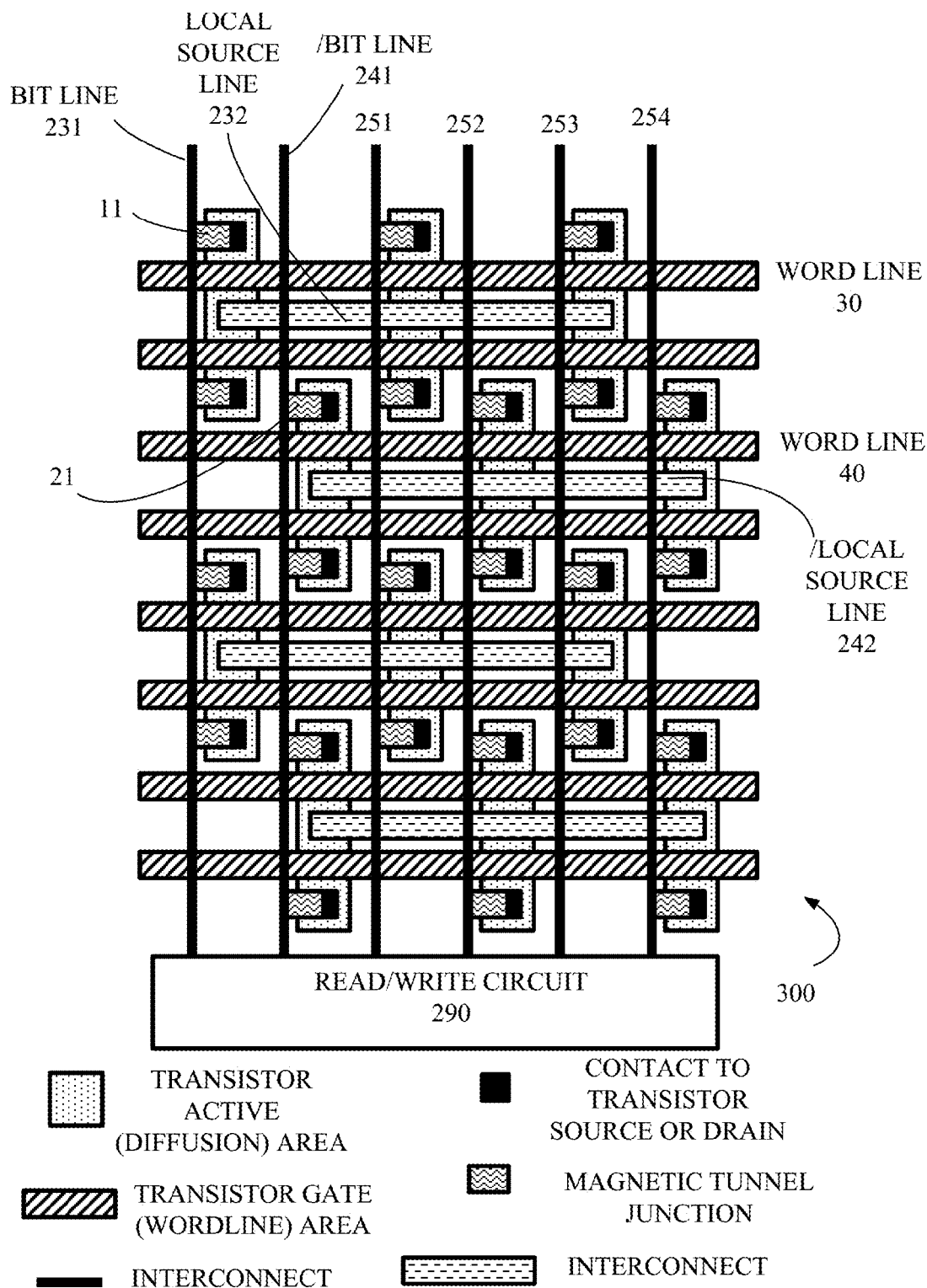
FIG. 5 is a layout diagrams representing a portion of a magnetic memory device that includes 2T2MTJ memory cells in accordance with an exemplary embodiment.

FIG. 5 illustrates a layout diagram corresponding to the architecture illustrated in FIG. 4. The partial array 300 shown in FIG. 5 includes the local source line 232 and/local source line 242, each of which is shared between a plurality of magnetic tunnel junctions and not directly connected to the read/write circuit 290. FIG. 5 has a folded bit line architecture, and the select devices and magnetic tunnel junctions in adjacent columns are vertically offset slightly in order to provide for correct placement of the word lines.

Figure 6:
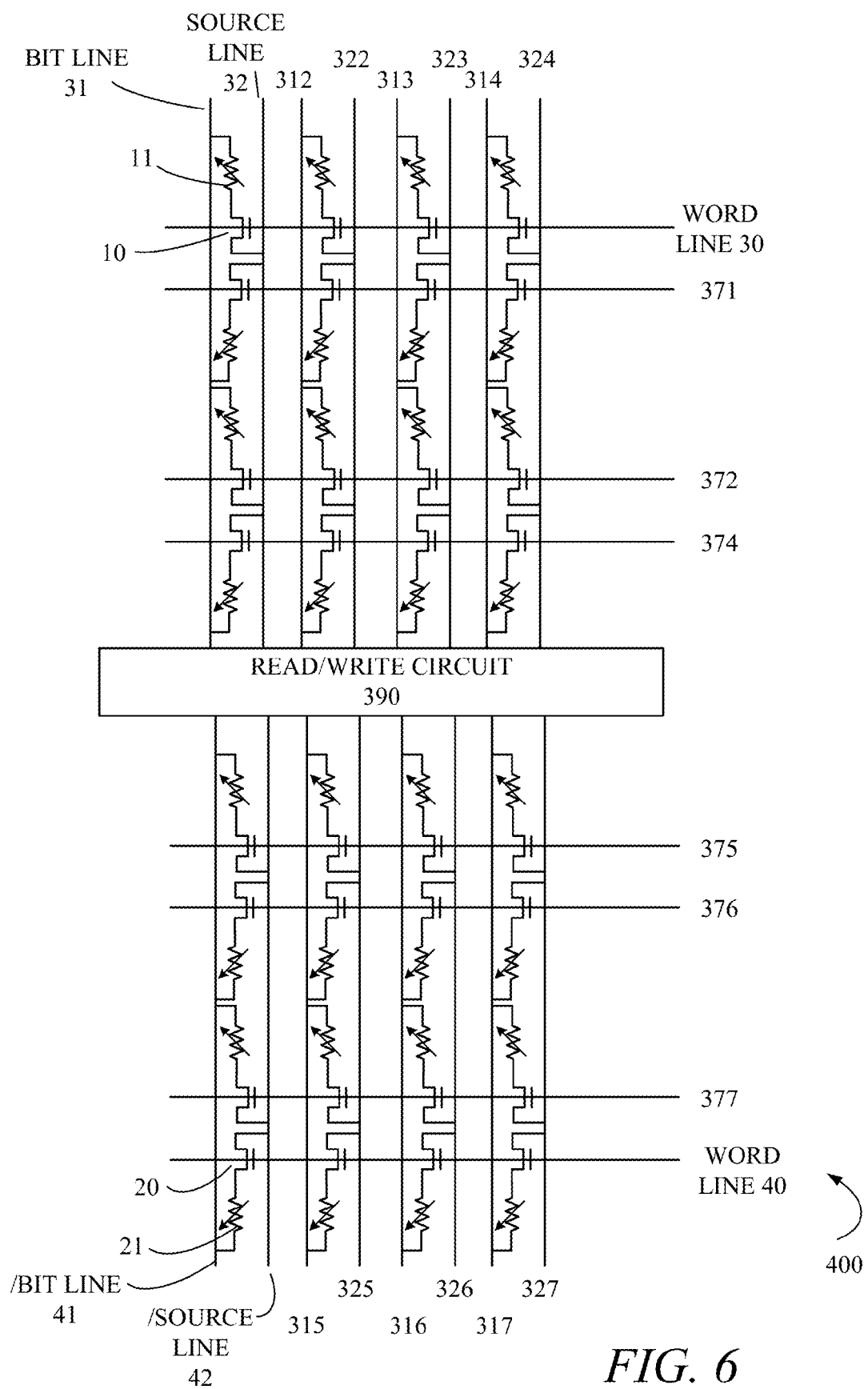
FIG. 6 is a schematic diagram of a portion of a magnetic memory device that includes 2T2MTJ memory cells in accordance with an exemplary embodiment.

FIG. 6 illustrates a schematic diagram of a partial memory device 300 that includes 2T2MTJ memory cells. The architecture of FIG. 6 is similar to that of FIG. 2 in that it does not include shared local source lines. As shown, source line 32 and/source line 42 are coupled to the read/write circuit 390. However, the embodiment shown in FIG. 6 differs from that of FIG. 2 in that it may be referred to as an "open" bit line architecture rather than a "folded" bit line architecture. The first half of the memory cell 100, which includes magnetic tunnel junction 11 and select device 10, is included in the partial array above the read/write circuit 390, and the second half of the memory cell 100, which includes magnetic tunnel junction 21 and select device 20, is included in the partial array below the read/write circuit 390. Functionally, the write operation in which down-current flows through magnetic tunnel junction 11 and up-current flows through magnetic tunnel junction 21 occurs in the same manner as in the structure of FIG. 2. The unused bit lines 312-317 do not need to be driven as is the case in the embodiment of FIG. 4 because there are no local source lines and the source lines can be driven directly by the read/write circuit 390. Word lines 371-377, which correspond to unselected memory cells are held at VSS. Unused source lines 322-327 are also depicted and, in some embodiments, are held at bias voltage above VSS in order to reduce the voltage stress across the select devices, where unnecessary voltage stress across the select devices can lead to premature breakdown of those devices.

Figure 7:
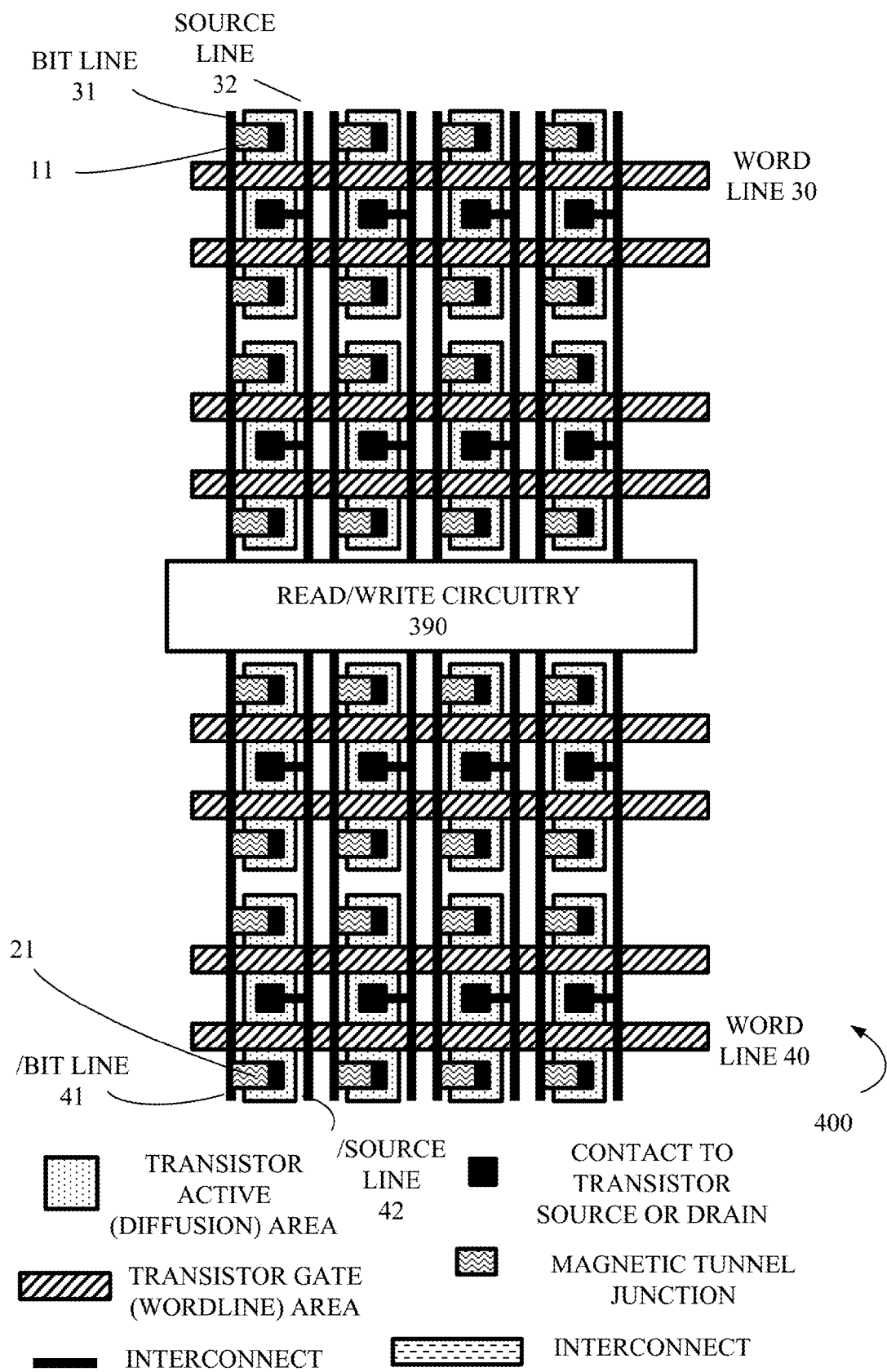
FIGS. 7-10 are layout diagrams representing a portion of a magnetic memory device that includes 2T2MTJ memory cells in accordance with exemplary embodiments.

FIG. 7 illustrates a layout diagram corresponding to the architecture illustrated in FIG. 6. The partial memory device 400 shown in FIG. 7 has an "open" bit line architecture in that it separates the two halves of each 2T2MTJ memory cell into separate arrays. As can be seen in FIG. 7, this allows each word line to control a select device in every column, and the select devices in neighboring columns are not vertically offset as was the case in FIGS. 3 and 5. Notably, the read/write circuit 390 is located between the two arrays illustrated. In some embodiments, the read circuit(s) that determines the bit stored in each memory cell is located such that the signals from each of the halves of the memory cell have a similar path to the read circuit. More specifically, in some embodiments, the characteristics of the signal routing from the first magnetic tunnel junction 11 to the read circuit are substantially similar to the characteristics of the signal routing between the second magnetic tunnel junction 21 and the read circuit. Such balanced routing helps to ensure that the read circuit is able to make an accurate comparison between the resistance of the two magnetic tunnel junctions. For example, if one signal path had significantly more capacitance or resistance than the other (or was significantly longer than the other), an accurate comparison might be more difficult or impossible.

Figure 8:
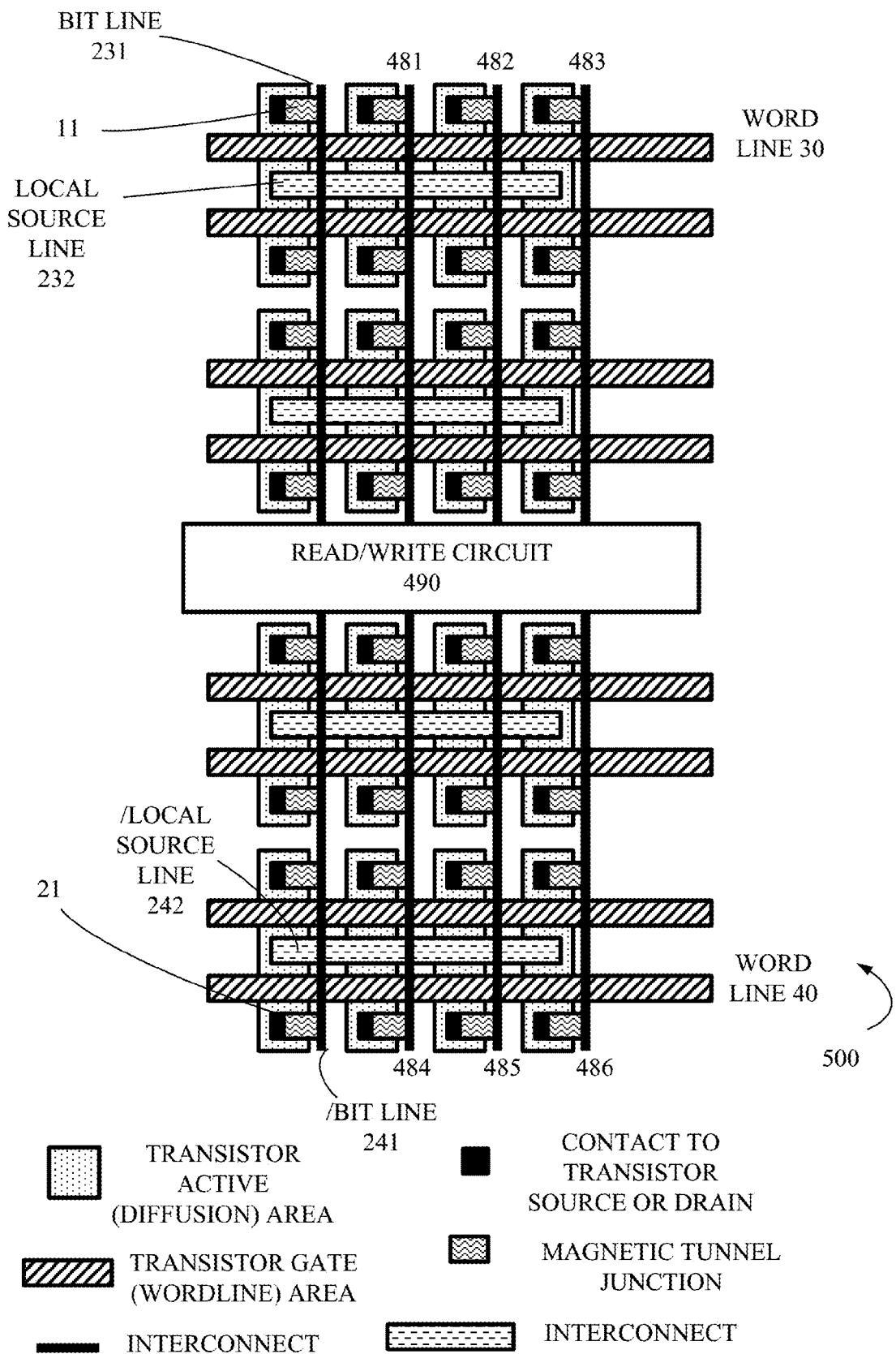

FIG. 8 illustrates a layout diagram of another partial memory device 500 that includes 2T2MTJ memory cells. The architecture of FIG. 8 is similar to that of FIGS. 4 and 5 in that it includes local source lines, including local source line 232 and/local source line/242. The embodiment shown in FIG. 8 differs from that of FIG. 5 in that it is an "open" bit line architecture rather than a "folded" bit line architecture. The first half of the memory cell 100, which includes magnetic tunnel junction 11 and its corresponding select device, is included in the partial array above the read/write circuit 490, and the second half of the memory cell 100, which includes magnetic tunnel junction 21 and its corresponding select device, is included in the partial array below the read/write circuit 490. Functionally, the write operation in which down-current flows through magnetic tunnel junction 11 and up-current flows through magnetic tunnel junction 21 occurs in the same manner as in the structure of FIGS. 4 and 5. The bit lines 481-483 are driven during read/write operations to magnetic tunnel junction 11 along with bit line 231, where local source line 232 acts as a node for allowing current to flow in series through bit lines 481-483 and bit line 231. Similarly bit lines 484-486 are driven along with/bit line 241 in order to provide current through magnetic tunnel junction 21.

Figure 9:
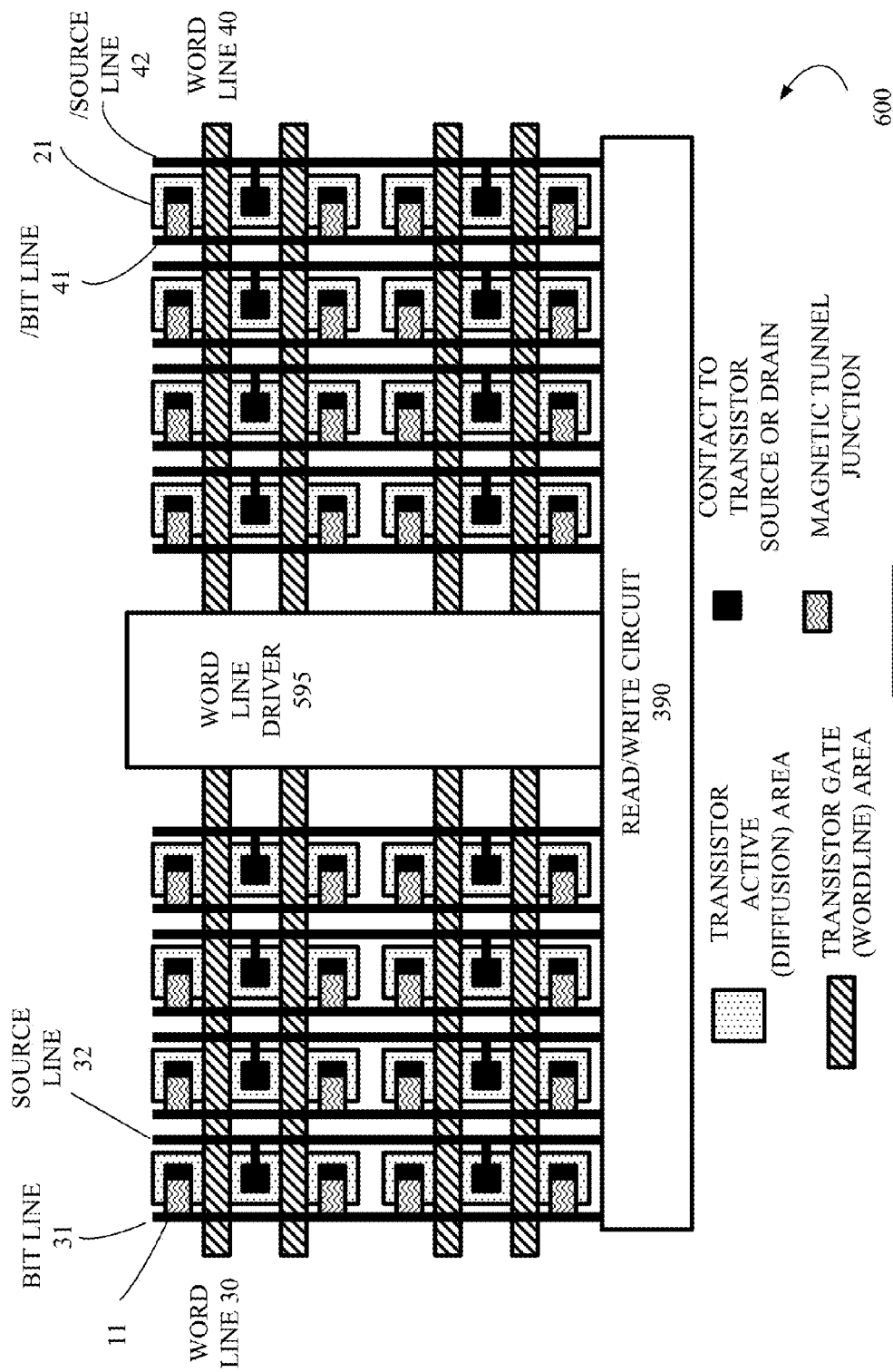

FIG. 9 illustrates a layout diagram corresponding to the architecture illustrated in FIG. 6 with the addition of word line driver 595 and the placement of the partial arrays on the same vertical side of the read/write circuit 390. The partial memory device 600 shown in FIG. 9 has an "open" bit line architecture in that it separates the two halves of each 2T2MTJ memory cell into separate arrays. As can be seen in FIG. 9, this allows each word line to control a select device in every column, and the select devices in neighboring columns are not vertically offset. This allows the word line driver 595 to drive related word lines 30 and 40 from a balanced, central position such that the routing from the word line driver 595 to the select devices for the magnetic tunnel junctions 11 and 21 is substantially similar. The read/write circuit 390 in FIG. 9 is preferably located such that the characteristics of the signal routing from the first magnetic tunnel junction 11 to the read circuit are substantially similar to the characteristics of the signal routing between the second magnetic tunnel junction 21 and the read circuit so that an accurate comparison can be performed.

Figure 10:
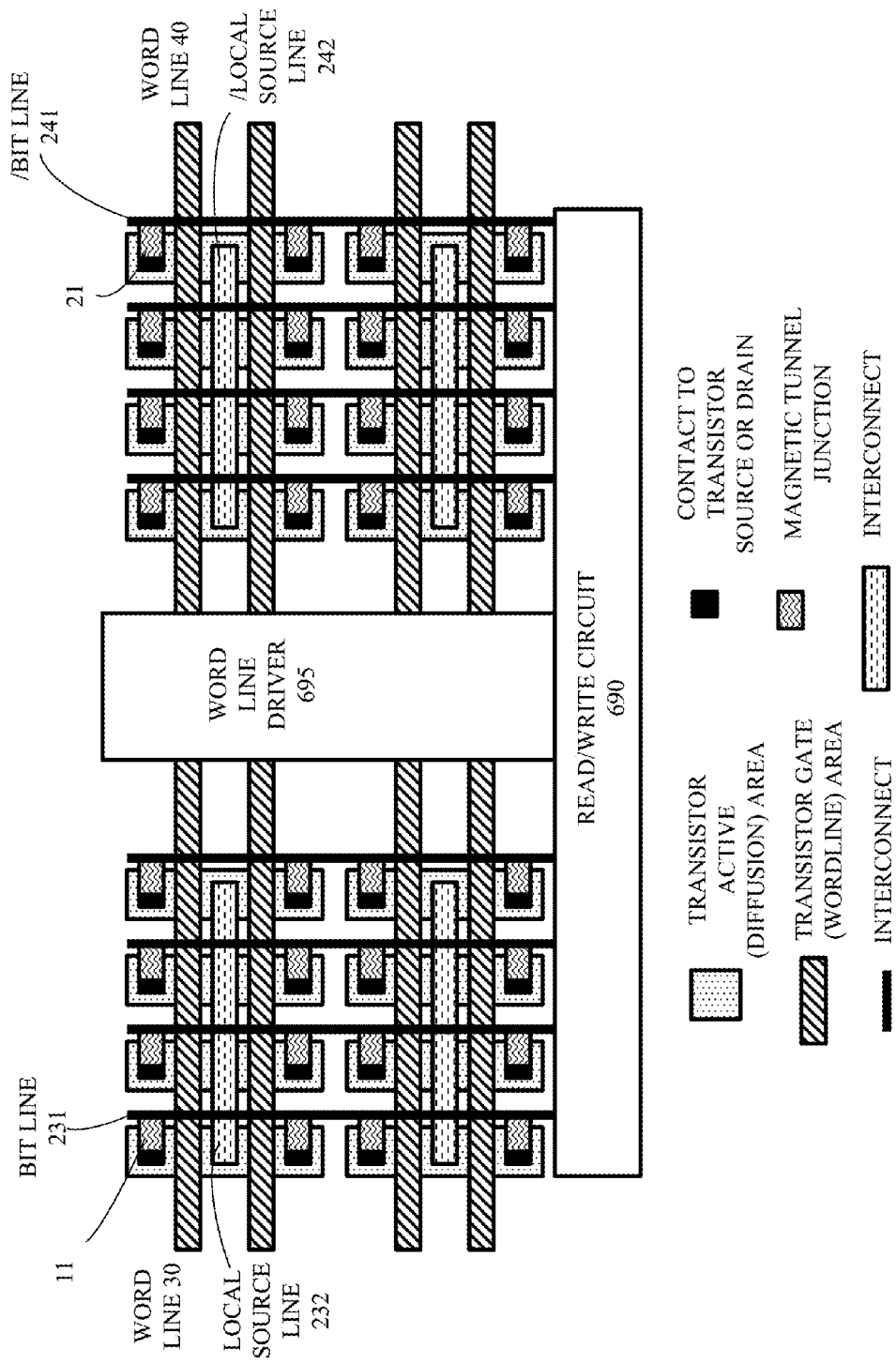

FIG. 10 illustrates a layout diagram very similar to the architecture illustrated in FIG. 8 with the addition of word line driver 695 and the placement of the partial arrays on the same vertical side of the read/write circuit 690. The partial memory device 600 shown in FIG. 10 includes local source lines and has an "open" bit line architecture in that it separates the two halves of each 2T2MTJ memory cell into separate arrays. Like the architecture in FIG. 9, this allows each word line to control a select device in every column, and the word line driver 695 is able to drive related word lines 30 and 40 in a balanced fashion. The read/write circuit 690 in FIG. 10 is located such that the characteristics of the signal routing from the first magnetic tunnel junction 11 to the read circuit are substantially similar to the characteristics of the signal routing between the second magnetic tunnel junction 21 and the read circuit. The balanced routing also applies to the bit lines used to provide current through the magnetic tunnel junctions 11 and 21 that rely on the local source line 232 or/local source line 242 as a coupling node.

Figure 11:
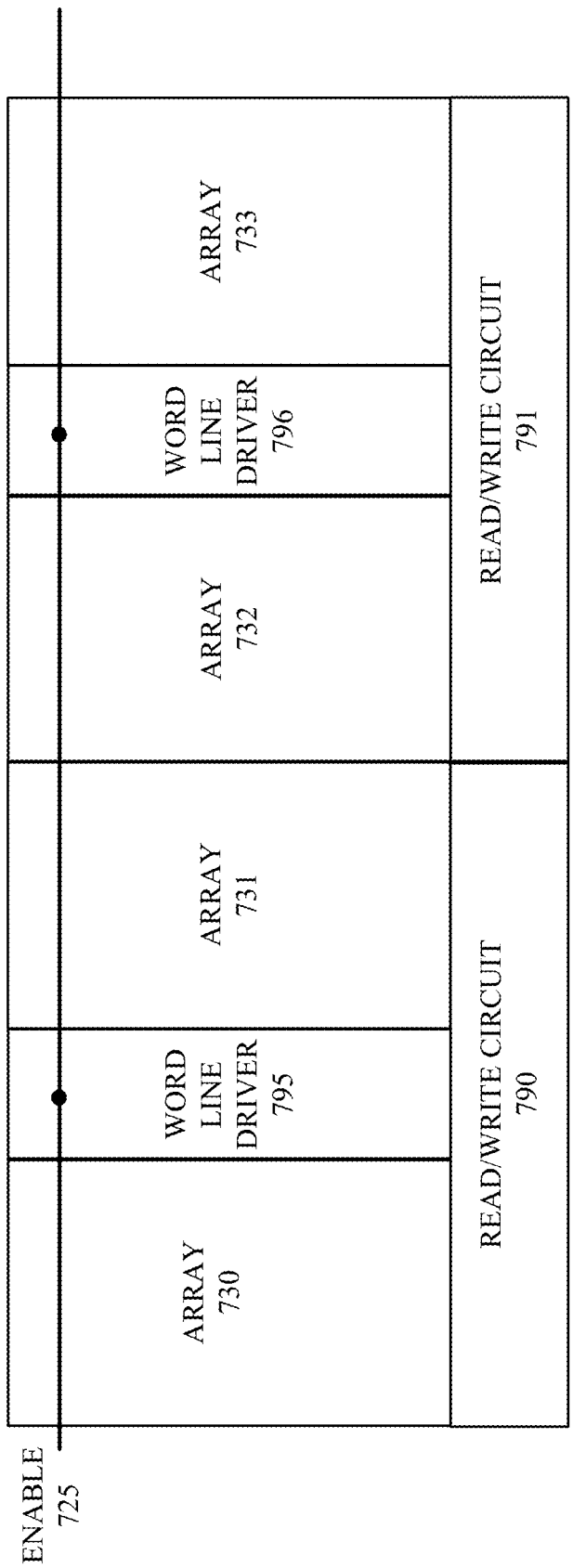
FIG. 11 is a block diagram of a portion of a magnetic memory device that includes 2T2MTJ memory cells in accordance an exemplary embodiment.

FIG. 11 illustrates a block diagram of a portion of a magnetic memory device that includes a plurality of read/write circuits 790, 791. Read/write circuit 790 is coupled to arrays 730 and 731 and provides the appropriate voltages on any bit lines and source lines used to perform read/write operations in the arrays 730 and 731. Word line driver 795 receives enable signal 725 and generates the appropriate word line voltages for the arrays 730 and 731 used for the read/write operations. The architecture for arrays 730 and 731 can vary, and examples are illustrated in FIGS. 9 and 10. Thus, arrays 730 and 731 may or may not include local source lines. Read/write circuit 791, arrays 732, 733, and word line driver 796 are similar to read/write circuit 790, arrays 730, 731, and word line driver 795.

Word line drivers 795 and 796 receive enable signal 725, which may be a global decode signal corresponding to higher-order address bits received by the memory device. The enable signal 725 provides an indication as to whether memory cells included in a portion of arrays 730-733 are to be accessed for a particular operation. Additional address signals are provided to circuitry that includes the word line drivers 795, 796 and read/write circuits 790, 791 to allow for local decoding that determines which word lines, bit lines, and source lines are to be driven for a particular operation. The local decoding controls the selective driving of the bit lines and source lines in the respective arrays by the read/write circuits 790, 791 as well as controlling the sense amplifiers selective coupling to, or sensing of, the memory cells in the arrays 730-733 for determination of data bits stored therein. Separation of the address information into global/local decoding segments is preferably done in a manner that ensures efficient operation of the memory device. Namely, accesses to the memory cells should be efficient in that the number of memory cells accessed for a certain operation does not unreasonably exceed the number of memory cells for which the stored bit is read or written. For example, a read operation preferably accesses only memory cells included in arrays 730 and 731 or 732 and 733, but not memory cells in both sets of arrays which would require both read/write circuits 790 and 791 need to be active during that read operation. Minimizing the number of word lines that need to be driven to accomplish a particular operation improves device efficiency and reduces power consumption.

Figure 12:
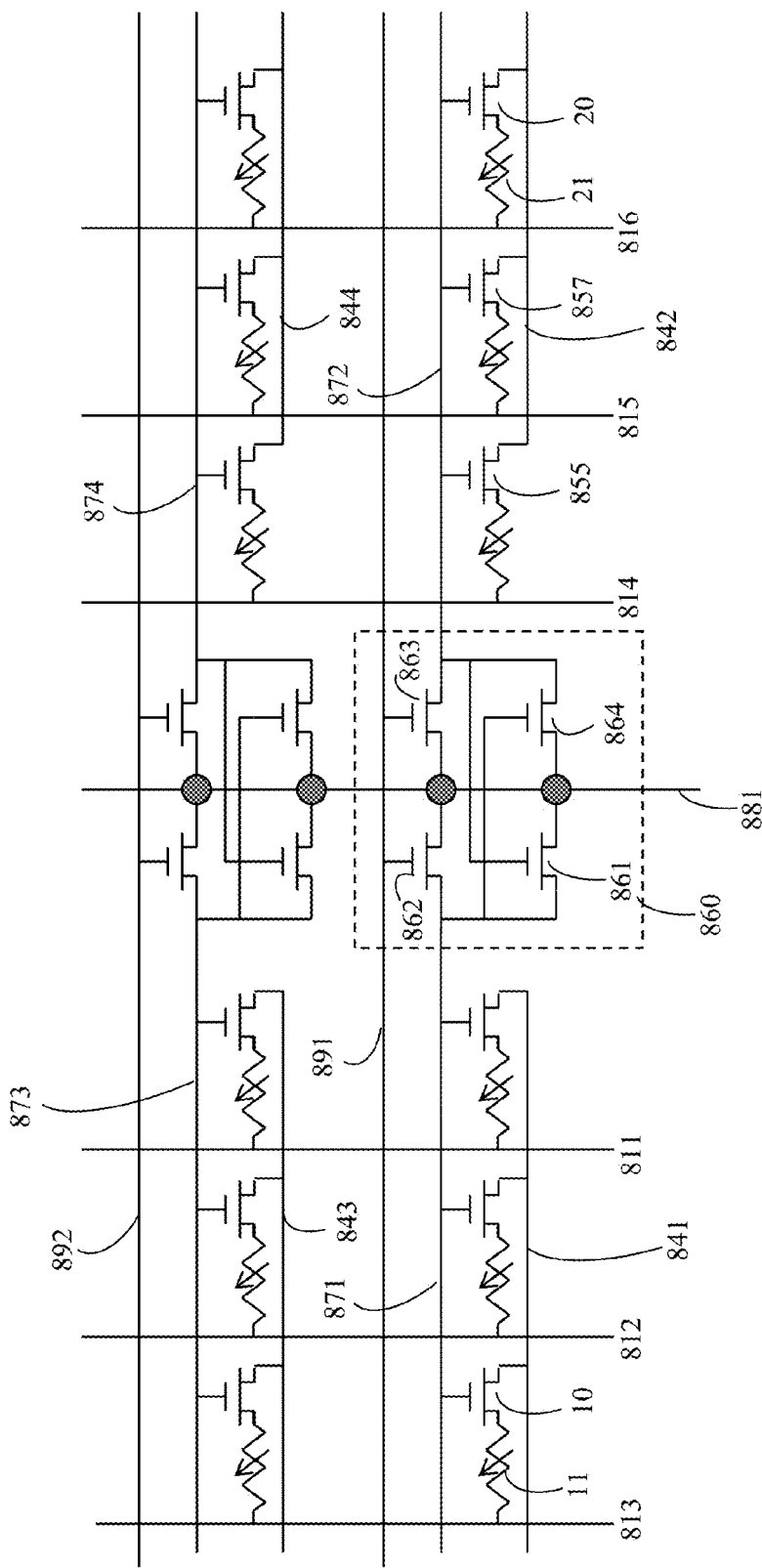
FIG. 12 is a schematic diagram of a portion of a magnetic memory device that includes 2T2MTJ memory cells in accordance with yet another exemplary embodiment.

FIG. 12 illustrates a schematic diagram of a portion of a magnetic memory that includes local source lines 841-844, word lines 871-874, and one embodiment of a word line driver 860. Word line driver 860 includes transistors 861-864 and drives word lines 871 and 872. The word line driver 860 receives enable signal 891, which indicates that word lines 871 and 872 should be driven, thereby providing access to the memory cells having select devices coupled to those word lines. In some embodiments, word line driver 860 is a portion of a larger circuit that drives a plurality of word lines corresponding to a plurality of rows of memory cells, where the circuit receives a higher-level (e.g. global) enable signal as well as address information that is decoded to generate the local enable signal 891. As illustrated, the select device 10 corresponding to a first half of memory cell 100 is coupled to word line 871, and the select device 20 corresponding to the second half of memory cell 100 is coupled to word line 872. Thus, to access memory cell 100 for read and write operations, both word lines 871 and 872 must be driven high to allow current to pass through select devices 10 and 20 and their corresponding magnetic tunnel junctions 11 and 21.

The word line driver 860 is provided with a voltage 881. In some embodiments, the voltage 881 corresponds to the appropriate voltage for a down-current write. In other words, the voltage 881 is at a level such that, after being passed through one of transistors 861-864, a first voltage is applied on one of the word lines 871, 872 that properly biases the select devices on that word line for a down-current write operation. The voltage 881 may be a voltage greater than the supply voltage associated with logic circuits on the memory device, where, in some embodiments, the voltage 881 is generated by a charge pump or other circuit that boosts the available supply voltage to the appropriate level. In yet other embodiments, the voltage 881 is a controlled voltage that varies with the operations to be performed such that different word line voltage levels can be attained by adjusting voltage 881.

As illustrated in FIG. 12, when the enable signal 891 is asserted high, transistors 862 and 863 are turned on, thereby actively driving the word lines to the first voltage based on voltage 881. In some embodiments, the first voltage is the voltage applied to the select devices for down-current writes as well as for read operations. During a read operation to memory cell 100, both word lines 871 and 872 are driven to the same voltage level to allow the resistance of magnetic tunnel junctions 11 and 21 to be sensed and compared. Because local source lines are used in the embodiment of FIG. 12, a read current is established through magnetic tunnel junction 11 by driving bit line 813 to one voltage, and driving bit lines 811 and 812 (and any other bit lines included in the group of half-memory cells sharing local source line 841) to another voltage, where the voltage differential induces the desired current. Similarly, a read current is established through magnetic tunnel junction 21 by driving bit line 816 to the same voltage driven onto bit line 813, and driving bit lines 814 and 815 (and any other bit lines included in the group of half-memory cells sharing local source line 842) to the voltage on bit lines 811 and 812. In other embodiments, a current source can be used to provide the desired current through the magnetic tunnel junctions 11 and 21.

In order to perform a write to the 2T2MTJ memory cell 100, different word line voltages are generated on word lines 871 and 872. While not shown in FIG. 12, in some embodiments a single word line driver accomplishes this by first driving one of the word lines to a first voltage, isolating that word line, and then driving the second word line to a second voltage higher than the first voltage. A keeper circuit or other circuit used to maintain the first voltage on the first word line can be used to ensure the appropriate voltage is maintained throughout the operation. Such an embodiment may require two separate voltage supplies to enable the different word line voltages.

Figure 13:
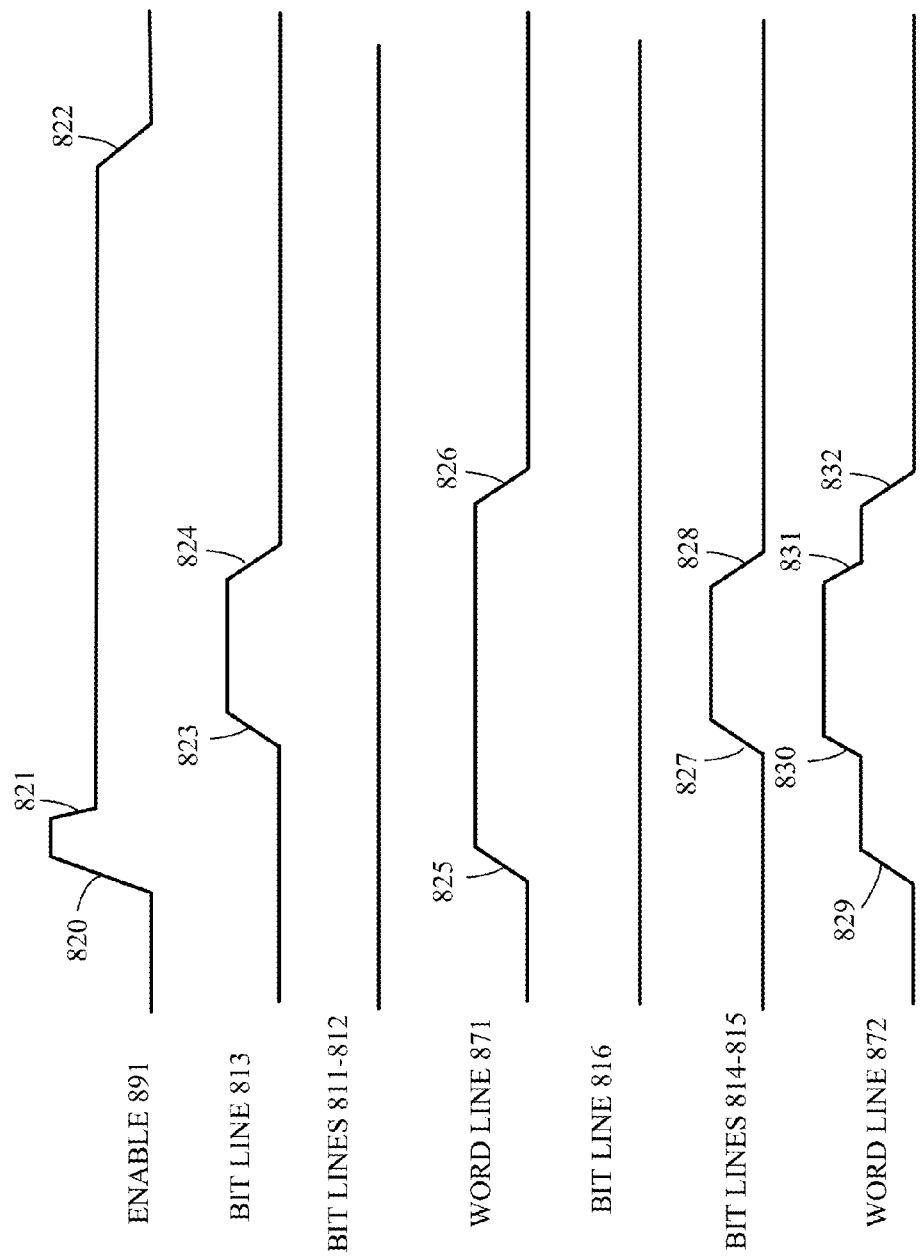
FIG. 13 is a timing diagram associated with certain signals included in the schematic diagram of FIG. 12 in accordance with an exemplary embodiment.

In order to avoid two separate voltage supplies, an "auto-booting" technique can be employed to boost the second word line voltage from a first voltage to a higher second voltage. In the shared local source line embodiment of FIG. 12, such auto-booting also makes use of the extra charge used in driving the multiple bit lines in the shared source line group, thereby mitigating some less-desirable aspects of the local source line architecture. The timing diagram in FIG. 13 corresponds to the signals in FIG. 12 when such auto-booting is employed in one example scenario. Both of the word lines 871, 872 are first driven to the first voltage using transistors 862 and 863 that are turned on based on the enable signal 891. As shown in FIG. 13, the enable signal 891 is initially driven (edge 820) to a voltage higher than the voltage on line 881 by at least the threshold voltage of transistors 862 and 863, which turns on transistors 862 and 863 such that word line 871 is pulled to the first voltage (edge 825) and word line 872 is also pulled to the first voltage (edge 829). In the case where the single data bit to be stored in the memory cell corresponds to a lower resistance in magnetic tunnel junction 11 and a higher resistance in magnetic tunnel junction 21, a down-current is applied to magnetic tunnel junction 11 and an up-current is applied to magnetic tunnel junction 21. As such, the first voltage on word line 871 is appropriate for the down-current, but a higher voltage may be appropriate on the word line 872 to support the up-current.

In order to generate the second, higher voltage on word line 872, the word lines 871 and 872 are first isolated from the voltage 881. This is accomplished by lowering the enable signal 891 (edge 821) to a level that turns off transistors 862 and 863, thereby electrically isolating word lines 871 and 872. The resulting isolated word lines are effectively floating in the sense that they can be influenced by capacitive coupling with other portions of the memory access circuitry. After isolating the word lines 871 and 872, bit line 813 is driven high (edge 823) while bit lines 811-812 are held low, thereby establishing a down-current through select device 10 and magnetic tunnel junction 11 using local source line 841. At the same time, bit lines 814-815 (and any other bit lines sharing local source line 842 corresponding to memory cells not being accessed) are driven high (edge 827) and bit line 816 is held low, thereby applying the appropriate voltage across select device 20 and magnetic tunnel junction 21 to establish the needed up-current. Because all of the bit lines corresponding to the shared local source line 842 are capacitively coupled to word line 872 via the select devices 857 and 855, raising those bit lines to a higher voltage raises the word line 872 (edge 830) to the higher second voltage needed for the up-current write. Thus, when the high voltage is applied to bit lines 814-815 and a low voltage is applied to bit line 816, the isolated word line holds a sufficient "auto-booted" voltage for the up-current write operation to occur. Because numerous bit lines need to be driven to a higher voltage to support the local source line configuration, utilizing the capacitive coupling of those bit lines to the word line to achieve a higher word line voltage without necessitating a greater driving supply voltage with respect to the word line can be advantageous in reducing power consumption.

In some embodiments, the desired word line voltage may be achieved by driving a controlled number of bit lines that interact with the word line to a higher voltage, thereby resulting in varying amounts of charge being placed on the isolated word line. In other embodiments, the amount of voltage increase on the isolated word line can be controlled by driving unused bit lines, which are capacitively coupled to the isolated word line, to varying voltage levels to achieve the desired voltage increase. In yet other embodiments, a supplemental voltage provider can be coupled to the isolated word line, where the supplemental voltage provider provides additional charge or drives a different voltage onto the isolated word line in order to ensure that the needed voltage level is achieved on the word line for the up-current write.

Note that when the word line 872 reaches the second voltage, which is greater than the first voltage, a feedback path in the word line driver 860 turns on transistor 861. Thus the voltage on word line 872 holds the voltage on the other word line 871 at the first voltage by coupling the word line 871 to the voltage 881. A similar feedback path from word line 871 turns on transistor 864 when memory cell 100 is written to the opposite state and word line 871 is auto-booted to enable an up-current write to magnetic tunnel junction 11. In other embodiments, different "keeper" circuits can be used instead of the cross-coupling within word line driver 860 to ensure that one or more of the voltages applied to word lines 871 and 872 are maintained for the appropriate time during read or write operations.

Once the write to the memory cell 100 is complete, the bit line 813 is returned low (edge 824). When bit lines 814-815 are returned low (edge 828), the capacitive coupling of those lines to word line 872 results in word line 872 also returning a lower voltage (edge 831). Word lines 871 and 872 can then be deasserted (edges 826 and 832), which corresponds to voltage 881 being returned to a low level. The enable signal 891 returning low (edge 822) indicates the completion of operations to this portion of the memory array.

While FIGS. 12 and 13 illustrates the "auto-booting" of a word line in the context of a memory that includes local source lines, it should be appreciated that once a word line is isolated, the bit lines coupled to the select devices controlled by the word line can be used to influence the voltage on the isolated word line in embodiments where shared local source lines are not employed. Thus, while the auto-booting concept may be particularly advantageous in a local source line embodiment where many bit lines are driven to a higher voltage to support memory cell accesses, it can also be used in embodiments without local source lines.

Figure 14:
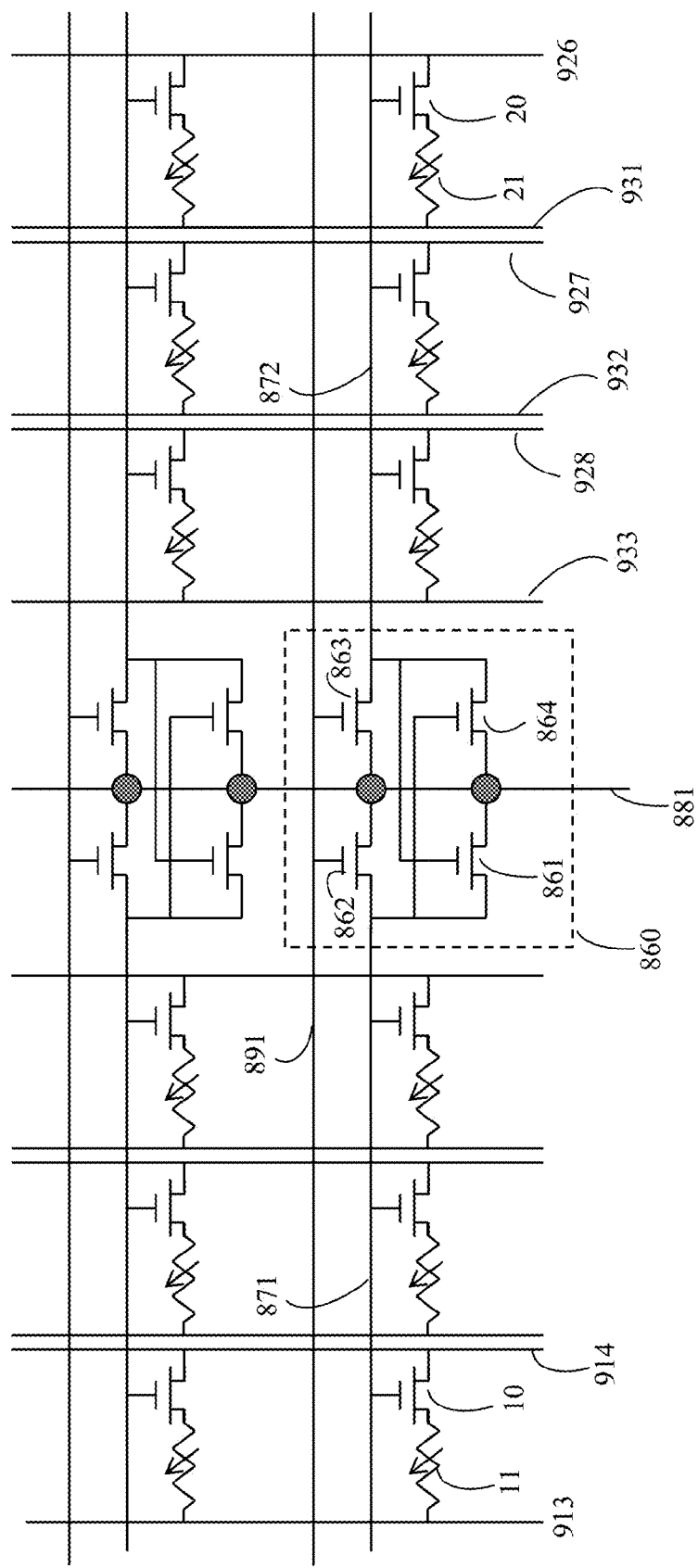
FIG. 14 is a schematic diagram of a portion of a magnetic memory device that includes 2T2MTJ memory cells in accordance with another exemplary embodiment.

FIG. 14 illustrates another partial memory device that includes the word line driver 860 but does not use local source lines. Notably, the word line driver 860 in FIG. 14 behaves in the same manner as the word line driver 860 of FIG. 12 with respect to reads and writes. In FIG. 14, because there are no local source lines, the unused bit lines need not be driven in order to provide the current flow through the magnetic tunnel junctions being accessed. For example, bit line 913 can be driven high and source line 914 driven low to cause a down-current write in magnetic tunnel junction 11 once word line 871 is raised to the first voltage. Similarly, providing a voltage differential across magnetic tunnel junction 21 and select device 20 can be achieved by driving bit line 931 and source line 926. However, in order to auto-boot word line 872, bit lines 932 and 933 and source lines 927 and 928 (and other bit and source lines capacitively coupled to word line 872) can be raised to a higher voltage after word line 872 is brought to the first voltage and isolated. Both bit lines 932, 933 and source lines 927, 928 are driven high in order to avoid current flow through the magnetic tunnel junctions coupled between those bit lines and source lines.

Figure 15:
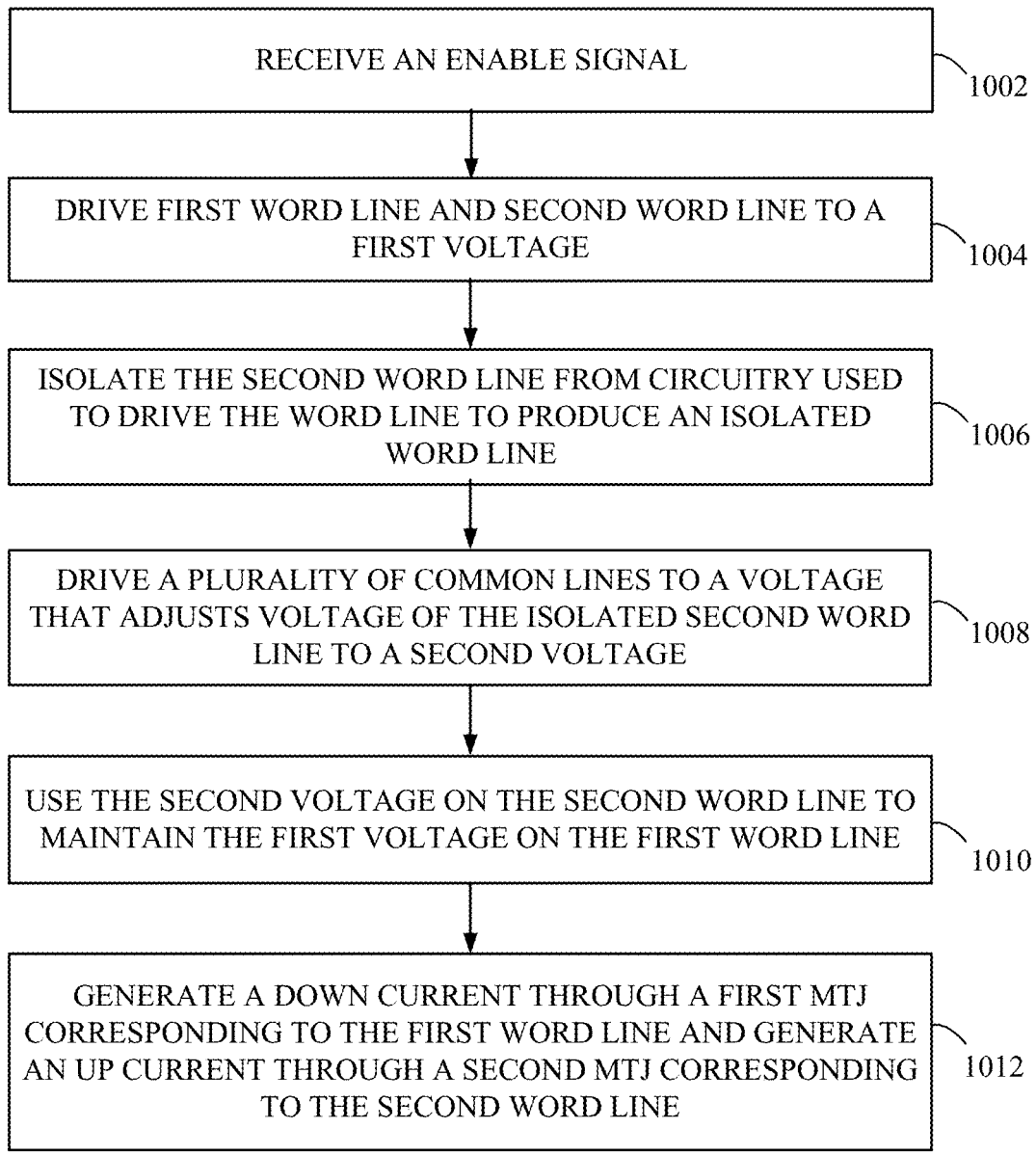
FIG. 15 is a flow chart of a method for writing to a 2T2MTJ memory cell in a magnetic memory in accordance with yet another exemplary embodiment.

FIG. 15 is a flow chart that illustrates an exemplary embodiment of a method of generating two word line voltages simultaneously on two word lines for a 2T2MTJ memory cell in a magnetic memory. In one example, the magnetic memory includes an array of spin-torque magnetic tunnel junction memory cells. The operations included in the flow charts may represent only a portion of the overall process used to operating the device. For illustrative purposes, the following description of the methods in FIG. 15 may refer to elements mentioned above in connection with FIGS. 1-14. It should be appreciated that method may include any number of additional or alternative tasks, the tasks shown in FIG. 15 need not be performed in the illustrated order, and the method may be incorporated into a more comprehensive procedure or process having additional functionality not described in detail herein. Moreover, one or more of the tasks shown in FIG. 15 could be omitted from an embodiment as long as the intended overall functionality remains intact.

At 1002, an enable signal is received. The enable signal provides an indication that two word lines are to be driven for a read or a write operation. Other signals may be received or generated to indicate the particular operation to be performed (e.g. read, write "0", write "1"), where those signals can be used to determine which voltages are to be driven onto the word lines and any common lines (e.g. bit lines, source lines) used to read and write data to the memory cells to which the word line corresponds. In the example embodiment of FIG. 15 the word lines are driven to support a write operation to a 2T2MTJ memory cell where two different word line voltages are used to support an up-current write to one magnetic tunnel junction and a down-current write to the other magnetic tunnel junction.

At 1004, a first word line and a second word line are driven to a first voltage. The first voltage may be a voltage greater in magnitude than a power supply voltage available on the memory device such that a charge pump or other circuit for generating a higher-magnitude voltage from an existing supply voltage is needed. In some embodiments, the first voltage corresponds to the voltage needed to support a down-current write.

At 1006, the second word line is isolated from the circuitry used to drive the second word line to the first voltage. Isolating the second word line may be accomplished by a variety of means, including reducing the gate voltage on a transistor gating a voltage to the word line such that the transistor behaves as a reverse-biased diode. In some embodiments, the first word line is also isolated when the second word line is isolated.

At 1008, a plurality of common lines, such as bit lines and/or source lines, are driven to a common-line voltage. Each common line of the plurality of common lines that is driven to the common-line voltage is capacitively coupled to the second word line. Such capacitive coupling may be based on the common lines being coupled to select devices that have the second word line coupled to their gates. In the example of an embodiment using local source lines, the plurality of common lines correspond to bit lines coupled to those memory cells that are not being accessed, but will source or sink a fraction of the current that is used to write to the selected memory cell. In embodiments without local source lines, the bit lines and/or source lines for the memory cells not being accessed can be driven. The common line voltage is different than the first word line voltage, and driving the plurality of common lines to the common line voltage adjusts the voltage on the isolated second word line to a second voltage. As discussed above, driving the plurality of common lines to the common-line voltage can provide an auto-boot feature with respect to the second word line, where, in some embodiments, the second word line voltage is boosted up to a level needed to enable an up-current write. Notably, in other embodiments, the capacitive coupling between the common lines and the word lines can be used to adjust the voltage on the word lines by different amounts and in different directions. Thus, the capacitive coupling between the plurality of common lines and the word line can be used to either raise or lower the voltage on either the first or second word line as needed.

In some embodiments, a supplemental voltage is applied to the second word line to maintain the desired voltage level on the second word line. Charge may begin to bleed off of the isolated second word line, thereby limiting the amount of time the second word line is at a voltage level effective for performing write operations within the memory device. In order to extend the length of time the second word line can effectively be used to perform write operations, a supplemental voltage can be applied to the second word line. The supplemental voltage may be applied using a supplemental voltage provider that is about equal to the second voltage, which, in some embodiments is the word line voltage needed to perform an up-current write. In such a case, the supplemental voltage may be in the form of a voltage supply that holds the second word line at the second voltage until up-current write operations are nearly complete. In other embodiments, the supplemental voltage is different in magnitude than the second voltage such that the supplemental voltage applied is able to either raise or lower the voltage level on the isolated word line. For example, if the auto-boot resulting from driving the plurality of common lines raises the voltage level on the word line above a desired voltage level, the supplemental voltage applied may lower the word line voltage as opposed to raising it.

At 1010, the second voltage on the second word line is used to maintain the first voltage on the first word line. For example, in embodiments where the first word line is also isolated from the source of the first voltage when the second word line is isolated, a feedback path or other keeper circuit such as the cross-coupled transistors in the word line drivers of FIGS. 12 and 14 can be used to maintain the first voltage on the first word line.

At 1012 a down current is generated through a first magnetic tunnel junction of the 2T2MTJ memory cell, where the first magnetic tunnel junction corresponds to the first word line in that the first word line is coupled to the gate of the select device that controls access to the first magnetic tunnel junction. Also at 1012, an up current is generated through a second magnetic tunnel junction of the 2T2MTJ memory cell, where the second magnetic tunnel junction corresponds to the second word line in that the second word line is coupled to the gate of the select device that controls access to the second magnetic tunnel junction. The respective currents can be generated by current generation circuitry. In some embodiment, the current generation circuitry uses current sources to provide the correct amounts of current needed, whereas in other embodiments, the current generation circuitry may include drivers that drive particular voltages onto common lines such as bit lines and source lines to achieve the desired current. In the context of the present disclosure, down-current corresponds to current that flows through the magnetic tunnel junction before the corresponding select device, and up-current corresponds to current that flows through the select device before the corresponding magnetic tunnel junction. The current generation circuitry used to provide the up-current and down-current may also be used to provide currents used to read the memory cell.

Notably, the first magnetic tunnel junction and second magnetic tunnel junction and their corresponding select devices can be arranged in any of the example layout architectures discussed above with respect to FIGS. 3, 5, and 7-10. Thus, the memory cells within the memory device can be arranged in "open" or "folded" architectures in which portions of each memory cell may be in different arrays or may be in neighboring columns (e.g. even and odd) in the same array. In yet other embodiments, portions of each memory cell may be in the same array, but positioned in non-neighboring columns.

Moreover, while much of the discussion above focuses on reading and writing to a single memory cell 100 in various scenarios, the memory devices that include such memory cells typically include a large number of such memory cells, where many memory cells are accessed together for read and write operations. Therefore, multiple read circuits are typically included on such memory devices, where a first read circuit performs the comparison and stored bit determination for one memory cell and a second read circuit performs the comparison and stored bit determination for another memory cell. In some embodiments, the first and second memory cells are accessed using the same two word lines, whereas in other embodiments, a first and second word line are used to access the first memory cell while a third and fourth word line are used to access the second memory cell. The same enable signal or separate, more local enable signals can be used to control the word line assertion as well as the assertion of any common lines used in accessing the first and second memory cells.

By providing circuits and techniques for driving two different voltages on two word lines for a 2T2MTJ memory cell, the two different currents needed for a write operation can be provided to the memory cell simultaneously, thereby reducing the time needed for writing to such memory cells. By utilizing auto booting achieve the higher voltage used for up-current writes on an isolated word line, the two different word line voltages can be derived from a single voltage supply, thereby simplifying device design, and, in the case of a memory using shared local source lines, reduces power consumption. Read circuits used to determine the single bit stored in each 2T2MTJ memory cell are placed in close proximity to the magnetic tunnel junctions in order to allow for faster read operations. The read circuits are preferably connected to the memory cells using signal lines that are balanced so that the signals from each half of the 2T2MTJ memory cell are not affected unilaterally, thereby helping to ensure an accurate comparison for determination of the data bit stored. In some embodiments, the read circuitry is located between two arrays of selections devices coupled to magnetic tunnel junctions in series, where one of the magnetic tunnel junctions for a selected memory cell is in a first of the two arrays and the second magnetic tunnel junction is in a second of the two arrays.

While exemplary embodiments have been presented above, it should be appreciated that many variations exist. Furthermore, while the description uses spin-torque MRAM devices that include memory cells in a specific example arrangements, the teachings may be applied to other memory devices having different architectures in which the same concepts can be applied. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A magnetoresistive memory, comprising:
 a first memory cell that includes:
  a first select device;
  a first magnetic tunnel junction coupled in series with the first select device;
  a second select device; and
  a second magnetic tunnel junction coupled in series with the second select device, wherein the first memory cell is configured to store a single bit by storing complementary states in the first and second magnetic tunnel junctions;
 a first word line coupled to the first select device;
 a second word line coupled to the second select device; and
 a first circuit configured to generate a first voltage on the first word line and a second voltage on the second word line, wherein the second voltage is greater in magnitude than the first voltage.

2. The magnetoresistive memory of claim 1, wherein:
 the first select device is included in a first plurality of select devices in an even column of an array; and
 the second select device is included in a second plurality of select devices in an odd column of the array.

3. The magnetoresistive device of claim 1 further comprising a first read circuit coupled to the first and second magnetic tunnel junctions, wherein the first read circuit is configured to determine the single bit stored in the first memory cell based on the complementary states stored in the first and second magnetic tunnel junctions.

4. The magnetoresistive device of claim 3, wherein characteristics of signal routing between the first magnetic tunnel junction and the first read circuit is substantially similar to characteristics of signal routing between the second magnetic tunnel junction and the first read circuit.

5. The magnetoresistive device of claim 3, wherein the first read circuit is physically between the first and second magnetic tunnel junctions in the magnetoresistive device.

6. The magnetoresistive device of claim 3, wherein the first circuit is further configured to receive an enable signal and apply the first voltage to the first and second word lines based on the enable signal.

7. The magnetoresistive device of claim 6, wherein the first circuit is further configured to:
 after applying the first voltage to the second word line based on the enable signal, isolate the second word line from a source of the first voltage, wherein the second voltage is achieved on the second word line while the second word line is isolated.

8. The magnetoresistive device of claim 7, wherein the first circuit is further configured to use the second voltage on the second word line to maintain the first voltage on the first word line.

9. The magnetoresistive device of claim 6, further comprising:
 a second memory cell that includes:
  a third select device;
  a third magnetic tunnel junction coupled in series with the third select device;
  a fourth select device; and
  a fourth magnetic tunnel junction coupled in series with the fourth select device; and
 a second read circuit coupled to the third and fourth magnetic tunnel junctions, wherein the second read circuit is configured to determine a single bit stored in the second memory cell based on complementary states stored in the third and fourth magnetic tunnel junctions.

10. The magnetoresistive device of claim 9, further comprising:
 a third word line coupled to the third select device;
 a fourth word line coupled to the fourth select device; and
 a second circuit configured to generate the first voltage on the third word line and the second voltage on the fourth word line.

11. The magnetoresistive device of claim 10, wherein the second circuit is further configured to receive the enable signal and apply the first voltage to the third and fourth word lines based on the enable signal.

12. The magnetoresistive device of claim 1 wherein the first voltage is greater in magnitude than a power supply voltage.

13. The magnetoresistive device of claim 1, further comprising a plurality of common lines capacitively coupled to the second word line, wherein the first circuit is configured to generate the second voltage on the second word line, wherein generating the second voltage on the second word line includes:
- after driving the second word line to the first voltage, isolating the second word line from a source of the first voltage; and
- after isolating the second word line, driving the plurality of common lines to a voltage greater than the first voltage such that the second word line is raised to the second voltage as a result of capacitive coupling between the plurality of common lines and the second word line.

14. The magnetoresistive memory of claim 1, wherein the first circuit is configured to:
- generate the first voltage on the first word line such that the first select device allows current flow through the first magnetic tunnel junction device; and
- generate the second voltage on the second word line such that the second select device allows current flow through the second magnetic tunnel junction device.

15. The magnetoresistive memory of claim 14, wherein the first circuit is further configured to use the second voltage on the second word line to maintain the first voltage on the first word line.

16. A magnetoresistive memory, comprising:
- a first memory cell that includes:
  - a first select device;
  - a first magnetic tunnel junction coupled in series with the first select device;
  - a second select device; and
  - a second magnetic tunnel junction coupled in series with the second select device, wherein the first memory cell is configured to store a single bit by storing complementary states in the first and second magnetic tunnel junctions;
- a first word line coupled to the first select device;
- a second word line coupled to the second select device;
- a plurality of common signal lines capacitively coupled to the second word line; and
- a circuit configured to:
  - drive a first voltage on the first word line;
  - drive the first voltage on the second word line;
  - after driving the first voltage on the second word line, isolating the second word line from a source of the first voltage;
  - after isolating the second word line, driving a second voltage on the plurality of common signal lines such that the second word line is boosted to a third voltage as a result of capacitive coupling between the plurality of common lines and the second word line, wherein the third voltage is greater in magnitude than the first voltage.

17. The magnetoresistive memory of claim 16 further comprising current generation circuitry coupled to the first and second magnetic tunnel junctions, the current generation circuitry configured to generate a first write current through the first magnetic tunnel junction and generate a second write current through the second magnetic tunnel junction, where the first write current flows through the first select device before the first magnetic tunnel junction and the second write current flows through the second magnetic tunnel junction before the second select device.

18. The magnetoresistive memory of claim 17, wherein the circuit is further configured to use the third voltage on the second word line to maintain the first voltage on the first word line.

19. The magnetoresistive memory of claim 17 further comprising:
- a read circuit coupled to the first and second magnetic tunnel junctions, wherein the read circuit is configured to determine, during a read operation, the single bit stored in the first memory cell based on the complementary states stored in the first and second magnetic tunnel junctions.

20. The magnetoresistive memory of claim 19, wherein during the read operation:
- the current generation circuitry generates a read current through each of the first and second magnetic tunnel junctions; and
- the circuit drives the first voltage on both the first and second word lines.

* * * * *